United States Patent
Iwase

(10) Patent No.: US 12,074,456 B2
(45) Date of Patent: Aug. 27, 2024

(54) POWER TRANSMISSION APPARATUS, POWER RECEPTION APPARATUS, CONTROL METHOD, AND COMPUTER-READABLE STORAGE MEDIUM

(71) Applicant: CANON KABUSHIKI KAISHA, Tokyo (JP)

(72) Inventor: Hajime Iwase, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 17/935,417

(22) Filed: Sep. 26, 2022

(65) Prior Publication Data

US 2023/0198315 A1 Jun. 22, 2023

Related U.S. Application Data

(63) Continuation of application No. PCT/JP2021/008184, filed on Mar. 3, 2021.

(30) Foreign Application Priority Data

Mar. 31, 2020 (JP) ................................ 2020-064204

(51) Int. Cl.
  *H02J 50/60* (2016.01)
  *H02J 50/12* (2016.01)
  *H02J 50/80* (2016.01)

(52) U.S. Cl.
  CPC .............. *H02J 50/60* (2016.02); *H02J 50/12* (2016.02); *H02J 50/80* (2016.02)

(58) Field of Classification Search
  CPC ........ H02J 50/60; H02J 50/80; H04B 5/0037; B60L 53/12; B60L 53/124; G01R 27/2688; G01R 27/26
  See application file for complete search history.

(56) References Cited

U.S. PATENT DOCUMENTS

2014/0125287 A1* 5/2014 Nakano ............... H02J 7/00034
  307/104
2015/0340878 A1* 11/2015 Oosumi ................. H02J 50/80
  307/104

(Continued)

FOREIGN PATENT DOCUMENTS

| JP | 2012135127 A | 7/2012 |
| JP | 5071574 B1 | 11/2012 |
| JP | 2013027255 A | 2/2013 |

(Continued)

*Primary Examiner* — Ryan Johnson

(74) *Attorney, Agent, or Firm* — Canon U.S.A., Inc. IP Division

(57) ABSTRACT

A power transmission apparatus that can wirelessly transmit power to a power reception apparatus via a power transmission coil and communicate with the power reception apparatus determines presence/absence of an object different from the power reception apparatus based on a Q factor of the power transmission coil measured in a phase for performing power transmission. The power transmission apparatus controls whether to execute the determination of presence/absence of the object different from the power reception apparatus based on measurement of the Q factor of the power transmission coil, based on information received from the power reception apparatus through communication that represents whether the power reception apparatus can execute predetermined processing associated with the determination of presence/absence of the object different from the power reception apparatus based on the measurement of the Q factor of the power transmission coil.

12 Claims, 9 Drawing Sheets

(56) References Cited

U.S. PATENT DOCUMENTS

| | | | |
|---|---|---|---|
| 2016/0139618 A1* | 5/2016 | Tsai | ............... G05F 1/66 700/292 |
| 2019/0280534 A1 | 9/2019 | Park | |

FOREIGN PATENT DOCUMENTS

| | | | |
|---|---|---|---|
| JP | 2013132133 A | 7/2013 | |
| JP | 2013135518 A | 7/2013 | |
| JP | 2016007116 A | 1/2016 | |
| JP | 2016096724 A | 5/2016 | |
| JP | 2017034972 A | 2/2017 | |
| JP | 2017070074 A | 4/2017 | |
| JP | 2018113849 A | 7/2018 | |
| JP | 2018129942 A | 8/2018 | |
| JP | 2018133993 A | 8/2018 | |
| JP | 2019097383 A | 6/2019 | |
| KR | 20200023522 A | 3/2020 | |
| WO | 2014155519 A1 | 10/2014 | |
| WO | 2019/088760 A1 | 5/2019 | |
| WO | 2020050507 A1 | 3/2020 | |

* cited by examiner

FIG. 13

| | bit 7 | bit 6 | bit 5 | bit 4 | bit 3 | bit 2 | bit 1 | bit 0 |
|---|---|---|---|---|---|---|---|---|
| Bank0 | Power Class | | Maximum Power Value | | | | | |
| Bank1 | | | | Reserved (1300) | | | | |
| Bank2 | Prop | Reserved (1301) | | | ZERO | Count | | |
| Bank3 | | Window Size | | | | Depth | Window Offset | |
| Bank4 | Neg | Polarity | | | | | Reserved (1302) | |

POWER TRANSMISSION APPARATUS, POWER RECEPTION APPARATUS, CONTROL METHOD, AND COMPUTER-READABLE STORAGE MEDIUM

CROSS-REFERENCE TO RELATED APPLICATIONS

This application is a Continuation of International Patent Application No. PCT/JP2021/008184, filed Mar. 3, 2021, which claims the benefit of Japanese Patent Application No. 2020-064204 filed Mar. 31, 2020, both of which are hereby incorporated by reference herein in their entirety.

BACKGROUND

Technical Field

The present disclosure relates to a power transmission apparatus, a power reception apparatus, a control method, and a computer-readable storage medium and, more particularly, to a foreign object detection technique in wireless power transfer.

Background Art

Technology development of wireless power transfer systems has widely been conducted, and a standard (WPC standard) formulated as a wireless power charging standard by a standardization organization, the Wireless Power Consortium (WPC), is widely known. In such wireless power transfer, it is important that if a foreign object exists in a range where a power transmission apparatus can transfer power, the foreign object is detected, and power transmission/reception is controlled. The foreign object is an object different from a power reception apparatus. Japanese Patent Laid-Open No. 2017-070074 describes a method of, if a foreign object exists near a power transmission/reception apparatus complying with the WPC standard, detecting the foreign object and restricting power transmission/reception. Japanese Patent Laid-Open No. 2017-034972 describe a technique of performing foreign object detection by short-circuiting a coil in a wireless power transfer system. Japanese Patent Laid-Open No. 2013-132133 describes a technique of detecting a foreign object based on a change of the Q factor (quality factor) of a power transmission coil in a wireless power transfer system, which is measured by applying a high-frequency signal to the coil for a predetermined period.

The present disclosure provides a technique of enabling, in a power transmission apparatus and a power reception apparatus, which comply with the WPC standard, accurate execution of detection of an object different from the power reception apparatus.

SUMMARY

According to an aspect of the present disclosure, there is provided a power transmission apparatus comprising a power transmission unit configured to wirelessly transmit power to a power reception apparatus via a power transmission coil, a communication unit configured to communicate with the power reception apparatus, a measurement unit configured to measure a Q factor of the power transmission coil in a phase for performing power transmission from the power transmission apparatus to the power reception apparatus, a determination unit configured to determine presence/absence of an object different from the power reception apparatus based on the Q factor of the power transmission coil, and a control unit configured to control whether to execute the determination of the presence/absence of the object different from the power reception apparatus based on measurement of the Q factor of the power transmission coil, based on information representing whether the power reception apparatus can execute predetermined processing associated with the determination of the presence/absence of the object different from the power reception apparatus based on the measurement of the Q factor of the power transmission coil, the information being received from the power reception apparatus by the communication unit.

Further features of the present disclosure will become apparent from the following description of exemplary embodiments with reference to the attached drawings.

BRIEF DESCRIPTION OF THE DRAWINGS

The accompanying drawings, which are incorporated in and constitute a part of the specification, illustrate embodiments of the present disclosure and, together with the description, serve to explain principles of the present disclosure.

FIG. 13 is a view showing the frame format of a Configuration Packet.

DESCRIPTION OF THE EMBODIMENTS

Figure 1:
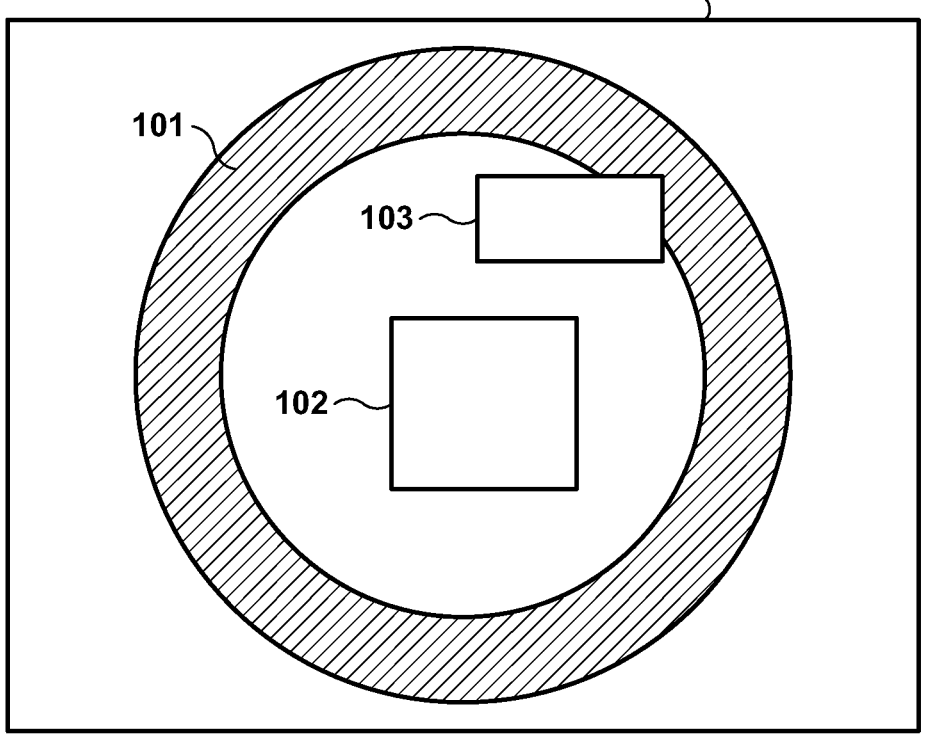
FIG. 1 is a view showing an example of the configuration of a wireless power transfer system.

Hereinafter, embodiments will be described in detail with reference to the attached drawings. Note, the following embodiments are not intended to limit the scope of the present disclosure. Multiple features are described in the embodiments, but limitation is not made to a present disclosure that requires all such features, and multiple such features may be combined as appropriate. Furthermore, in the attached drawings, the same reference numerals are given to the same or similar configurations, and redundant description thereof is omitted.

(System Configuration)

FIG. 1 shows an example of the configuration of a wireless power transfer system according to this embodiment. In an example, the wireless power transfer system is configured to include a power transmission apparatus 100 and a power reception apparatus 102. The power transmission apparatus 100 and the power reception apparatus 102 are assumed to comply with the WPC (Wireless Power Consortium) standard. The power transmission apparatus 100 is an electronic device that wirelessly transmits power to, for example, the power reception apparatus 102 placed on the self-apparatus. The power transmission apparatus 100 wirelessly transmits power to the power reception apparatus 102 via a power transmission coil 101. The power reception apparatus 102 is, for example, an electronic device that receives power from the power transmission apparatus 100 and charges an internal battery. The power reception apparatus 102 may be configured to be incorporated in another apparatus (a camera, a smartphone, a tablet PC, a laptop, an automobile, a robot, a medical device, or a printer) and supply power to these apparatuses. The power transmission apparatus 100 may be a smartphone or the like. In this case, for example, the power reception apparatus 102 may be another smartphone or a wireless earphone. The power reception apparatus 102 may be a transport plane or a vehicle such as an automobile, and the power transmission apparatus 100 may be a charger installed in the console of the transport plane or the vehicle such as an automobile.

FIG. 1 shows a situation in which a conductive foreign object 103 exists in a range (operating volume) affected by wireless power output from the power transmission coil 101. If the foreign object 103 exists in the operating volume, the power transmission/reception efficiency lowers, and a problem such as heat generation may occur in some cases. It is therefore important for the power transmission apparatus 100 and the power reception apparatus 102 to detect the foreign object 103 and execute power transmission/reception control. In this embodiment, the power transmission apparatus 100 and the power reception apparatus 102 measure a Q factor (Quality factor) from the time-rate change of a voltage in the power transmission coil, detect the foreign object 103, and control power transmission/reception within the range of control complying with the WPC standard. Examples of the configurations of the apparatuses for executing such a procedure and the procedure of the processing will be described below in detail. Note that the foreign object 103 is an object different from the power reception apparatus. The foreign object 103 is, for example, a conductive object such as a metal piece or an IC card.

(Configurations of Apparatuses)

Figure 2:
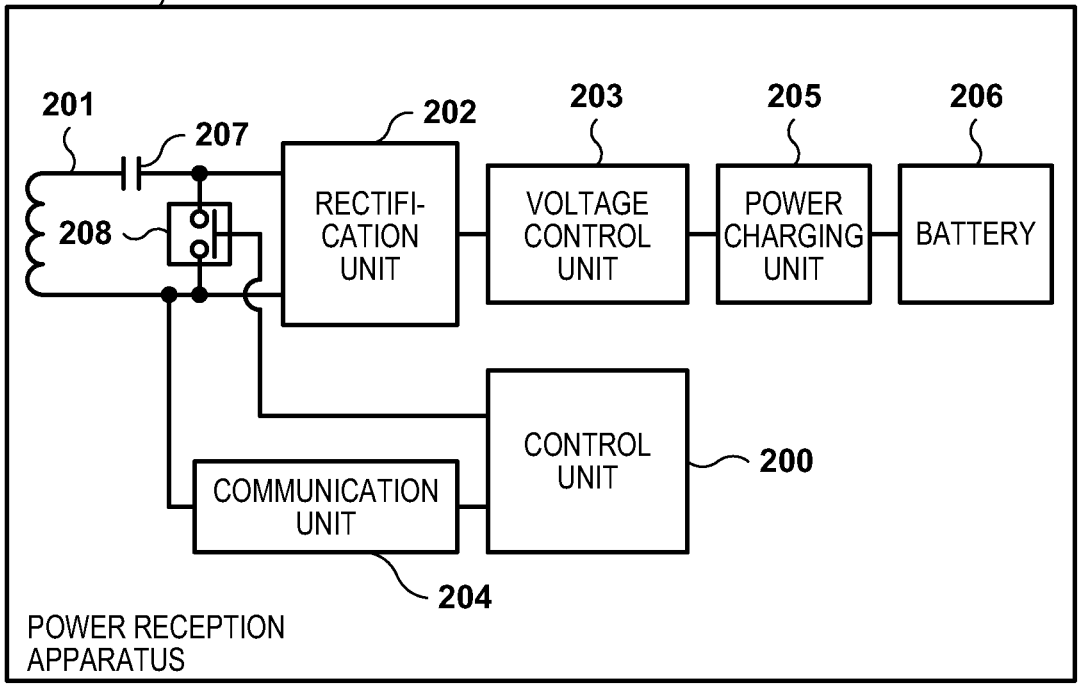
FIG. 2 is a block diagram showing an example of the configuration of a power reception apparatus.

FIG. 2 shows an example of the configuration of the power reception apparatus 102. The power reception apparatus 102 is configured to include, for example, a control unit 200, a power reception coil 201, a rectification unit 202, a voltage control unit 203, a communication unit 204, a power charging unit 205, a battery 206, a resonant capacitor 207, and a switch 208. The control unit 200 controls the entire power reception apparatus 102. The control unit 200 is configured to include, for example, one or more processors such as a CPU (Central Processing Unit) and an MPU (Micro Processing Unit). Note that the control unit 200 may include, for example, one or more storage devices such as a RAM (Random Access Memory) and a ROM (Read Only Memory). The control unit 200 can be configured to, for example, execute a program stored in the storage device by the processor, thereby executing each process to be described later. The power reception coil 201 is a coil used to receive power from the power transmission coil 101 of the power transmission apparatus 100. The rectification unit 202 converts an AC voltage and an AC current received via the power reception coil 201 into a DC voltage and a DC current. The voltage control unit 203 converts the level of the DC voltage input from the rectification unit 202 into a level of the DC voltage (that is neither too high nor too low) suitable for the operations of the control unit 200, the power charging unit 205, and the like. The voltage control unit 203 also supplies the voltage of the converted level to the power charging unit 205. The power charging unit 205 charges the battery 206 by the voltage supplied from the voltage control unit 203. The communication unit 204 performs control communication of wireless power charging based on WPC standard with respect to the power transmission apparatus 100. The control communication is performed by load-modulating the AC voltage and the AC current received by the power reception coil 201.

Also, the power reception coil 201 is connected to the resonant capacitor 207 and configured to resonate at a specific frequency F2. The switch 208 is a switch configured to short-circuit the power reception coil 201 and the resonant capacitor 207 and is controlled by the control unit 200. If the switch 208 is turned on, the power reception coil 201 and the resonant capacitor 207 form a series resonance circuit. At this time, a current flows only to the closed circuit of the power reception coil 201, the resonant capacitor 207, and the switch 208, and no current flows to the rectification unit 202 and the voltage control unit 203. On the other hand, if the switch 208 is turned off, a current flows to the rectification unit 202 and the voltage control unit 203 via the power reception coil 201 and the resonant capacitor 207.

Figure 3:
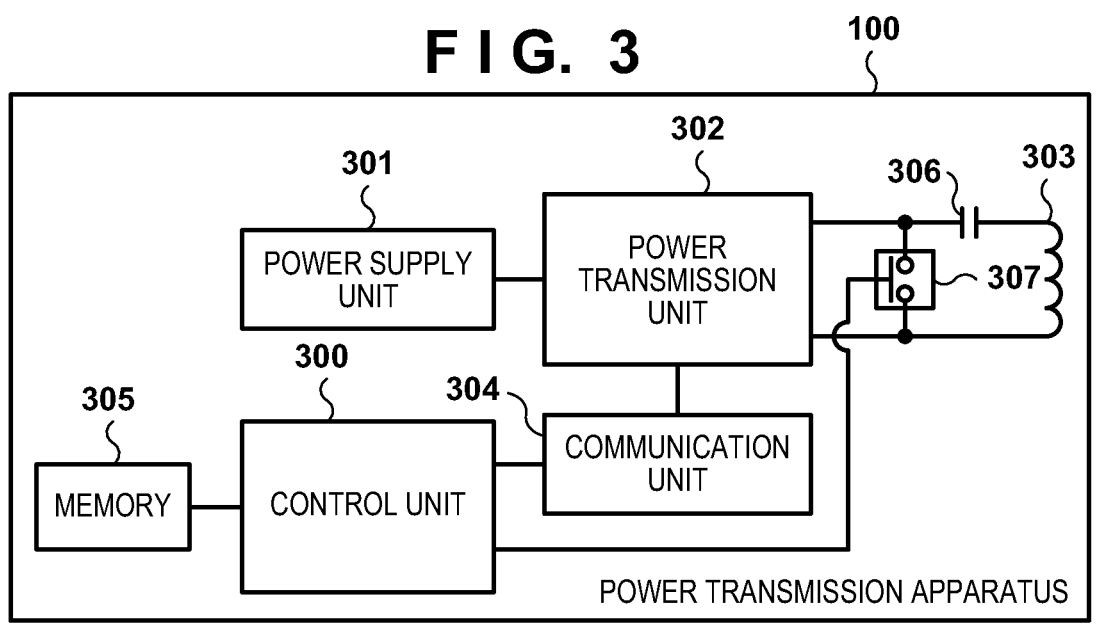
FIG. 3 is a block diagram showing an example of the configuration of a power transmission apparatus.

FIG. 3 shows an example of the configuration of the power transmission apparatus 100. The power transmission apparatus 100 is configured to include, for example, a control unit 300, a power supply unit 301, a power transmission unit 302, a power transmission coil 303, a communication unit 304, a memory 305, a resonant capacitor 306, and a switch 307. The control unit 300 controls the entire power transmission apparatus 100. The control unit 300 is configured to include, for example, one or more processors such as a CPU and an MPU. Note that the control unit 300 can be configured to, for example, execute, by the processor, a program stored in the memory 305 to be described later or a storage device incorporated in the control unit 300, thereby executing each process to be described later. The power supply unit 301 supplies power to each functional block. The power supply unit 301 is, for example, a commercial power supply or a battery. The battery can store power supplied from, for example, a commercial power supply.

The power transmission unit 302 converts DC or AC power input from the power supply unit 301 into AC power in a frequency band to be used for wireless power transfer, and inputs the AC power to the power transmission coil 303, thereby causing the power transmission coil 303 to generate an electromagnetic wave to be received by the power reception apparatus 102. For example, the power transmission unit 302 converts a DC voltage supplied from the power supply unit 301 into an AC voltage by a switching circuit having a half bridge or full bridge configuration using an FET (Field Effect Transistor). In this case, the power transmission unit 302 includes a gate driver that ON/OFF-controls the FET. Also, the power transmission unit 302 adjusts at least one of the voltage (transmission voltage) and the current (transmission current) input to the power transmission coil 303 or a frequency, thereby controlling the intensity or the frequency of the electromagnetic wave to be output. For example, the power transmission unit 302 increases the intensity of the electromagnetic wave by making the transmission voltage or the transmission current large, and decreases the intensity of the electromagnetic wave by making the transmission voltage or the transmission current small. Here, assume that the power transmission unit 302 has a capability of supplying power to output power of 15 watt (W) to the power charging unit 205 of the power reception apparatus 102 corresponding to the WPC standard. In addition, the power transmission unit 302 performs output control of AC power based on an instruction from the control unit 300 such that the output of the electromagnetic wave from the power transmission coil 303 is started or stopped.

The communication unit 304 performs communication for power transmission control based on the WPC standard with the power reception apparatus 102 via the power transmission coil 303. The communication unit 304 modulates an AC voltage and an AC current output from the power transmission unit 302 using frequency modulation (FSK (Frequency Shift Keying)) and transfers the information to the power reception apparatus 102. In addition, the communication unit 304 demodulates an AC voltage and an AC current modulated by load modulation of the communication unit 204 of the power reception apparatus 102, thereby obtaining information transmitted from the power reception apparatus 102. That is, the communication unit 304 superimposes information to be transmitted to the power reception apparatus 102 on the electromagnetic wave transmitted from the power transmission unit 302 and detects a power reception signal superimposed on the electromagnetic wave by the power reception apparatus 102, thereby communicating with the power reception apparatus 102. Also, the communication unit 304 may communicate with the power reception apparatus 102 in accordance with a standard different from the WPC standard using a coil (or antenna) different from the power transmission coil 303. In addition, the communication unit 304 may communicate with the power reception apparatus 102 by selectively using a plurality of communication functions. The memory 305 stores, for example, control programs to be executed by the control unit 300 and information such as the states of the power transmission apparatus 100 and the power reception apparatus 102. For example, the state of the power transmission apparatus 100 is obtained by the control unit 300. The state of the power reception apparatus 102 is obtained by the control unit 200 of the power reception apparatus 102 and transmitted from the power charging unit 205. The power transmission apparatus 100 obtains information representing the state via the communication unit 304.

The power transmission coil 303 is connected to the resonant capacitor 306 and configured to resonate at a specific frequency F1. The switch 307 is a switch configured to short-circuit the power transmission coil 303 and the resonant capacitor 306 and is controlled by the control unit 300. If the switch 307 is turned on, the power transmission coil 303 and the resonant capacitor 306 form a series resonance circuit. At this time, a current flows only to the closed circuit of the power transmission coil 303, the resonant capacitor 306, and the switch 307. If the switch 307 is turned off, power is supplied from the power transmission unit 302 to the power transmission coil 303 and the resonant capacitor 306.

Figure 4:
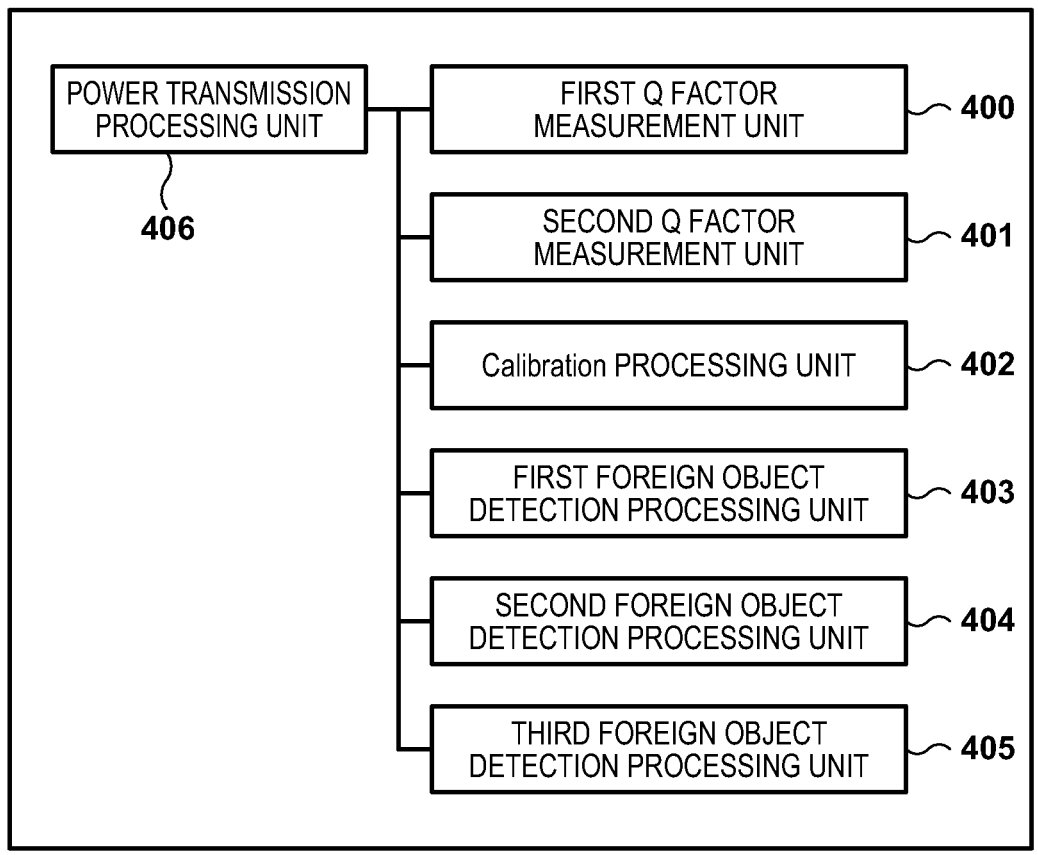
FIG. 4 is a block diagram showing an example of the functional configuration of the control unit of the power transmission apparatus.

FIG. 4 shows an example of the functional configuration implemented by the control unit 300 of the power transmission apparatus 100. The control unit 300 can operate as functional units including, for example, a first Q factor measurement unit 400, a second Q factor measurement unit 401, a Calibration processing unit 402, a first foreign object detection processing unit 403, a second foreign object detection processing unit 404, a third foreign object detection processing unit 405, and a power transmission processing unit 406. The first Q factor measurement unit 400 performs measurement of a Q factor in a frequency domain (first Q factor measurement), as will be described later. The second Q factor measurement unit 401 performs measurement of a Q factor in a time domain (second Q factor measurement), as will be described later. The Calibration processing unit 402 performs obtaining of a Calibration data Point and Calibration curve creation processing, as will be described later. The first foreign object detection processing unit 403 executes foreign object detection processing (first foreign object detection processing) based on a first Q factor measured by the first Q factor measurement unit 400. The second foreign object detection processing unit 404 executes foreign object detection processing (second foreign object detection processing) based on a power loss method to be described later. The third foreign object detection processing unit 405 executes foreign object detection processing (third foreign object detection processing) based on a second Q factor measured by the second Q factor measurement unit 401. The power transmission processing unit 406 performs processing concerning power transmission start, power transmission stop, and increase/decrease of transmission power in the power transmission unit 302. The processing units shown in FIG. 4 are configured as, for example, a plurality of independent programs, and can operate concurrently while making synchronization between the plurality of programs by event processing or the like.

Figure 5:
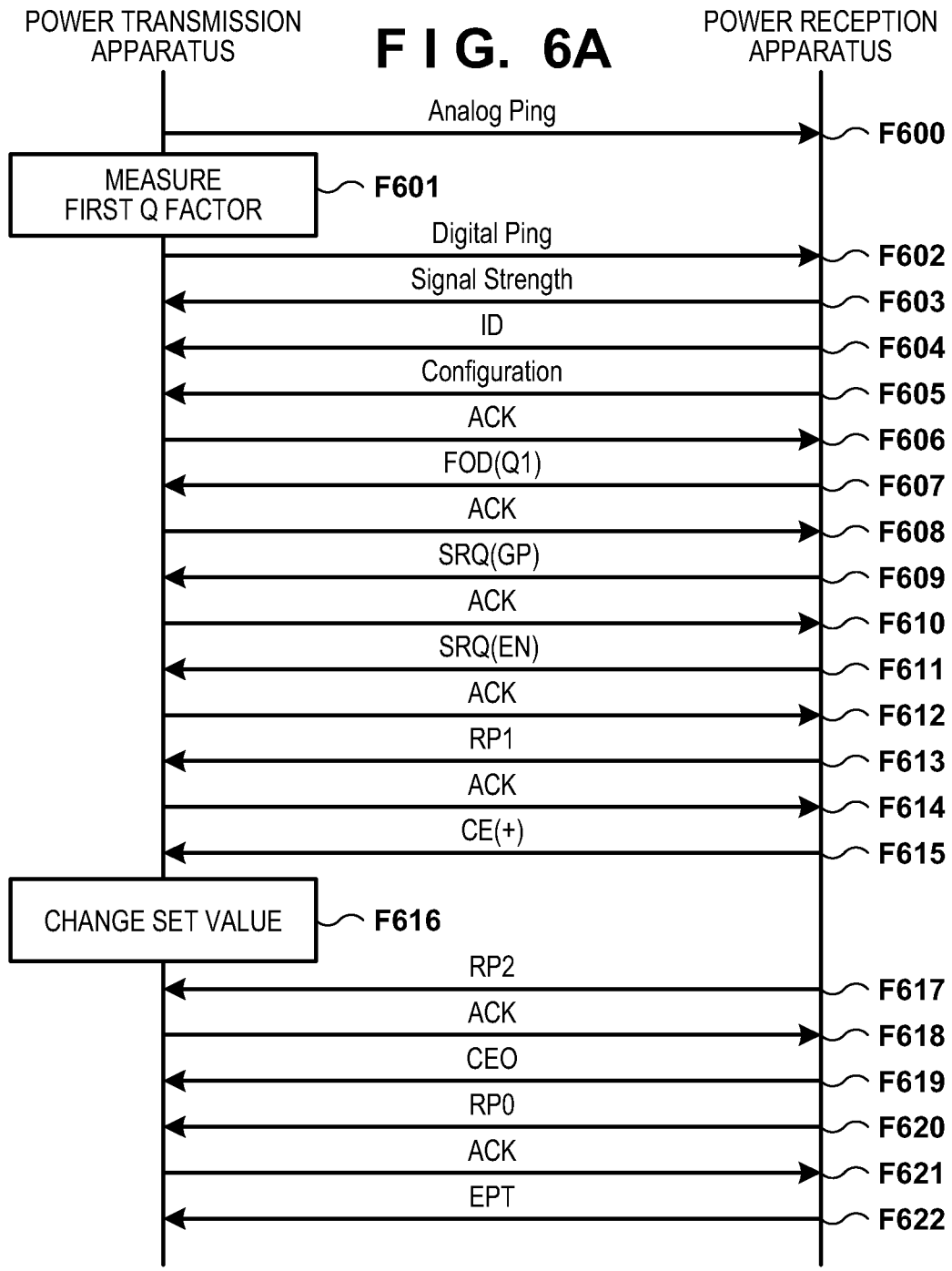
FIG. 5 is a block diagram showing an example of the functional configuration of the control unit of the power reception apparatus.

FIG. 5 shows an example of the functional configuration implemented by the control unit 200 of the power reception apparatus 102. The control unit 200 can operate as functional units including, for example, a second Q factor measurement unit 500 and a power reception processing unit 501. The second Q factor measurement unit 500 performs measurement of a Q factor in a time domain (second Q factor measurement), as will be described later. The power reception processing unit 501 performs processing concerning power reception start and power reception stop of the power reception apparatus 102, and increase/decrease of power requested to the power transmission apparatus 100. The processing units shown in FIG. 5 are configured as independent programs, and can operate concurrently while making synchronization between the programs by event processing or the like.

(Foreign Object Detection Method in WPC Standard)

Foreign object detection methods defined by the WPC (Wireless Power Consortium) standard will be described next using the power transmission apparatus 100 and the power reception apparatus 102 as an example. A foreign object detection method (first foreign object detection method) based on a Q factor measured in the frequency domain and a foreign object detection method (second foreign object detection method) based on a power loss method will be described here.

(1) Foreign Object Detection Method Based on Q Factor Measured in Frequency Domain (First Foreign Object Detection Method)

In the first foreign object detection method, first, the power transmission apparatus 100 measures, in the frequency domain, a Q factor that changes due to the influence of a foreign object (first Q factor measurement). This measurement is executed after the power transmission apparatus 100 transmits an Analog Ping until a Digital Ping is transmitted (see F601 in FIG. 6A). For example, to measure the Q factor, the power transmission unit 302 sweeps the frequency of wireless power output from the power transmission coil 303, and the first Q factor measurement unit 400 measures the voltage value at the terminal portion of the resonant capacitor 306 connected in series (or in parallel) with the power transmission coil. The first Q factor measurement unit 400 searches for a resonance frequency at which the voltage value exhibits a peak, and calculates the Q factor of the power transmission coil 303 from the resonance frequency and a frequency indicating a voltage value lower by 3 dB than the peak voltage value measured at the resonance frequency.

The Q factor may be measured by another method. For example, the power transmission unit 302 sweeps the frequency of wireless power output from the power transmission coil 303, and the first Q factor measurement unit 400 measures the voltage value at the terminal portion of the resonant capacitor 306 connected in series with the power transmission coil 303, and searches for a resonance frequency at which the voltage value exhibits a peak. Then, the first Q factor measurement unit 400 measures the voltage values at the two terminals of the resonant capacitor 306 at the resonance frequency, and calculates the Q factor of the power transmission coil 303 based on the ratio of the voltage values at the two terminals.

After the Q factor of the power transmission coil 303 is calculated, the first foreign object detection processing unit 403 of the power transmission apparatus 100 obtains a Q factor serving as the judgement criterion of foreign object detection from the power reception apparatus 102 via the communication unit 304. For example, the first foreign object detection processing unit 403 receives, from the power reception apparatus 102, the Q factor (first characteristic value) of the power transmission coil in a case where the power reception apparatus is placed on the power transmission coil defined by the WPC standard. The Q factor is stored in an FOD (Foreign Object Detection) Status packet transmitted from the power reception apparatus 102, and the power transmission apparatus 100 receives the FOD Status packet, thereby obtaining the Q factor. The first foreign object detection processing unit 403 estimates, from the obtained Q factor, the Q factor of the power transmission coil 303 in a case where the power reception apparatus 102 is placed on the power transmission apparatus 100. In this embodiment, the estimated Q factor will be expressed as a first reference Q factor. Note that the Q factor stored in the FOD Status packet can be stored in the nonvolatile memory (not shown) of the power reception apparatus 102 in advance. That is, the power reception apparatus 102 can notify the power transmission apparatus 100 of the Q factor stored in advance. Note that the Q factor corresponds to Q1 to be described later.

The first foreign object detection processing unit 403 of the power transmission apparatus 100 compares the first reference Q factor with the Q factor measured by the first Q factor measurement unit 400, and determines the presence/absence of a foreign object based on the comparison result.

For example, using a Q factor lower by a % (first ratio) than the first reference Q factor as a threshold, if the measured Q factor is lower than the threshold, the first foreign object detection processing unit 403 determines that the possibility of presence of a foreign object is high, and otherwise, determines that the possibility of absence of a foreign object is high.

(2) Foreign Object Detection Method Based on Power Loss Method (Second Foreign Object Detection Method)

Figure 11:
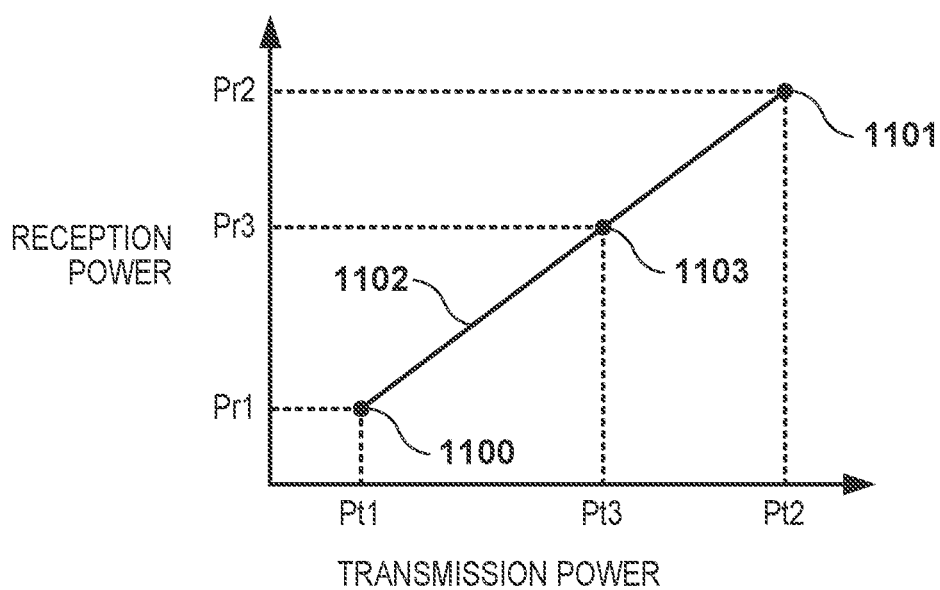
FIG. 11 is a view for explaining foreign object detection by a power loss method.

A foreign object detection method based on the power loss method defined by the WPC standard will be described next with reference to FIG. 11. FIG. 11 is a conceptual view of foreign object detection by the power loss method. The abscissa represents transmission power of the power transmission apparatus 100, and the ordinate represents received power of the power reception apparatus 102. Note that control of transmission power by the power transmission unit 302 of the power transmission apparatus 100 can be performed by the power transmission processing unit 406.

First, the power transmission unit 302 of the power transmission apparatus 100 transmits a Digital Ping to the power reception apparatus 102. The communication unit 304 of the power transmission apparatus 100 receives a received power value Pr1 (called Light Load) in the power reception apparatus 102 by a Received Power Packet (mode1). Note that the Received Power Packet (mode1) will be referred to as "RP1" hereinafter. Pr1 is the received power value in a case where the power reception apparatus 102 does not supply received power to loads (the power charging unit 205 and the battery 206). The control unit 300 of the power transmission apparatus 100 stores, in the memory 305, the relationship (a point 1100 shown in FIG. 11) between the received Pr1 and a transmission power value Pt1 at the time of obtaining Pr1. Accordingly, the power transmission apparatus 100 can recognize that the power loss amount between the power transmission apparatus 100 and the power reception apparatus 102 when Pt1 is transmitted as the transmission power is Pt1−Pr1 (Ploss1).

Next, the communication unit 304 of the power transmission apparatus 100 receives, from the power reception apparatus 102, the value of a received power value Pr2 (called Connected Load) in the power reception apparatus 102 by a Received Power Packet (mode2). Note that the Received Power Packet (mode2) will be referred to as "RP2" hereinafter. Pr2 is the received power value in a case where the power reception apparatus 102 supplies received power to the loads. The control unit 300 of the power transmission apparatus 100 stores, in the memory 305, the relationship (a point 1101 shown in FIG. 11) between the received Pr2 and a transmission power value Pt2 at the time of obtaining Pr2. Accordingly, the power transmission apparatus 100 can recognize that the power loss amount between the power transmission apparatus 100 and the power reception apparatus 102 when Pt2 is transmitted as the transmission power is Pt2−Pr2 (Ploss2).

The Calibration processing unit 402 of the power transmission apparatus 100 linearly interpolates the points 1100 and 1101, thereby creating a line 1102. The line 1102 corresponds to the relationship between the transmission power and the received power in a state in which no foreign object exists around the power transmission apparatus 100 and the power reception apparatus 102. Hence, the power transmission apparatus 100 can predict, from the transmission power value and the line 1102, received power in a state in which the possibility of absence of a foreign object is high. For example, as for a case where the transmission power value is Pt3, the power transmission apparatus 100 can predict that the received power value is Pr3 from a point 1103 on the line 1102 corresponding to the case where the transmission power value is Pt3.

Here, assume that if the power transmission unit 302 of the power transmission apparatus 100 transmits power to the power reception apparatus 102 by the transmission power Pt3, the communication unit 304 receives a received power value Pr3' from the power reception apparatus 102. The second foreign object detection processing unit 404 of the power transmission apparatus 100 calculates Pr3–Pr3' (=Ploss_FO) that is a value obtained by subtracting the received power value Pr3' actually received from the power reception apparatus 102 from the received power value Pr3 in a state in which a foreign object does not exist. Ploss_FO can be considered as a power loss consumed by a foreign object when the foreign object exists between the power transmission apparatus 100 and the power reception apparatus 102. Hence, if the power Ploss_FO that would be consumed by the foreign object exceeds a predetermined threshold, the second foreign object detection processing unit 404 can judge that a foreign object exists. The threshold is derived based on, for example, the relationship between the point 1100 and the point 1101.

Also, the second foreign object detection processing unit 404 of the power transmission apparatus 100 obtains, in advance, a power loss amount Pt3–Pr3 (Ploss3) between the power transmission apparatus 100 and the power reception apparatus 102 from the received power value Pr3 in a state in which a foreign object does not exist. The second foreign object detection processing unit 404 calculates a power loss amount Pt3–Pr3' (Ploss3') between the power transmission apparatus 100 and the power reception apparatus 102 in a state in which a foreign object exists from the received power value Pr3' received from the power reception apparatus 102 in a state in which it is unclear whether a foreign object exists. Then, the second foreign object detection processing unit 404 calculates Ploss3'–Ploss3. If the value exceeds a predetermined threshold, it can be judged that a foreign object exists. Note that Ploss3'–Ploss3=Pt3–Pr3'–Pt3+Pr3=Pr3–Pr3'. Hence, the power Ploss_FO predicted to be consumed by the foreign object can be estimated by comparing the power loss amounts.

As described above, the power Ploss_FO that would be consumed by the foreign object may be calculated as Pr3–Pr3' that is the difference of received power, or may be calculated as Ploss3'–Ploss3 (=Ploss_FO) that is the difference of power loss.

After the line 1102 is obtained by the Calibration processing unit 402, the second foreign object detection processing unit 404 of the power transmission apparatus 100 periodically receives the current received power value (for example, Pr3' described above) from the power reception apparatus 102 via the communication unit 304. The current received power value periodically transmitted from the power reception apparatus 102 is transmitted as a Received Power Packet (mode0) to the power transmission apparatus 100. The second foreign object detection processing unit 404 of the power transmission apparatus 100 performs foreign object detection based on the line 1102 and the received power value stored in the Received Power Packet (mode0). Note that the Received Power Packet (mode0) will be referred to as (RP0) hereinafter.

Note that in this embodiment, the points 1100 and 1101 used to obtain the line 1102 representing the relationship between the transmission power and the received power in a state in which a foreign object does not exist around the power transmission apparatus 100 and the power reception apparatus 102 will be referred to as "Calibration data Points". In addition, a line segment (line 1102) obtained by interpolating at least two Calibration data Points will be referred to as "Calibration curve". The Calibration data Points and the Calibration curve (second reference) are used for foreign object detection processing by the second foreign object detection processing unit 404.

(Q Factor Measuring Method in Time Domain)

Figure 12A:
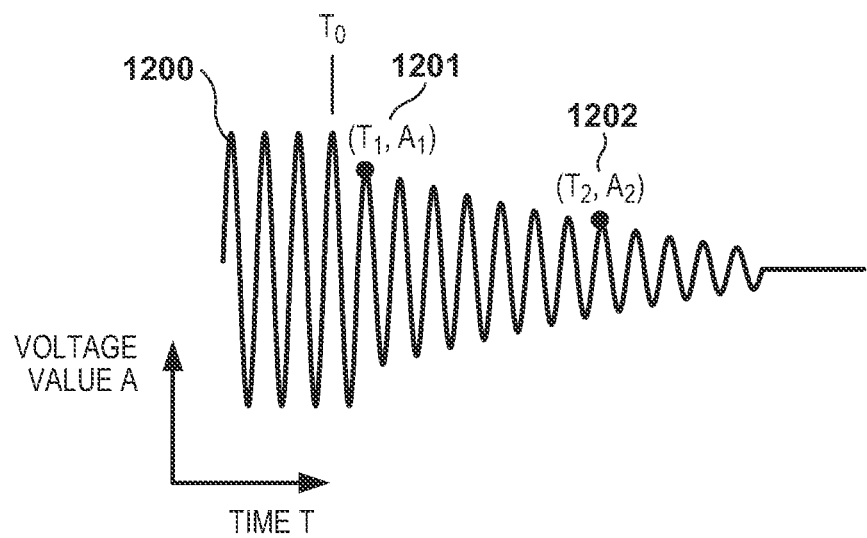
FIG. 12A is a view for explaining a Q factor measuring method in a time domain.
Figure 12B:
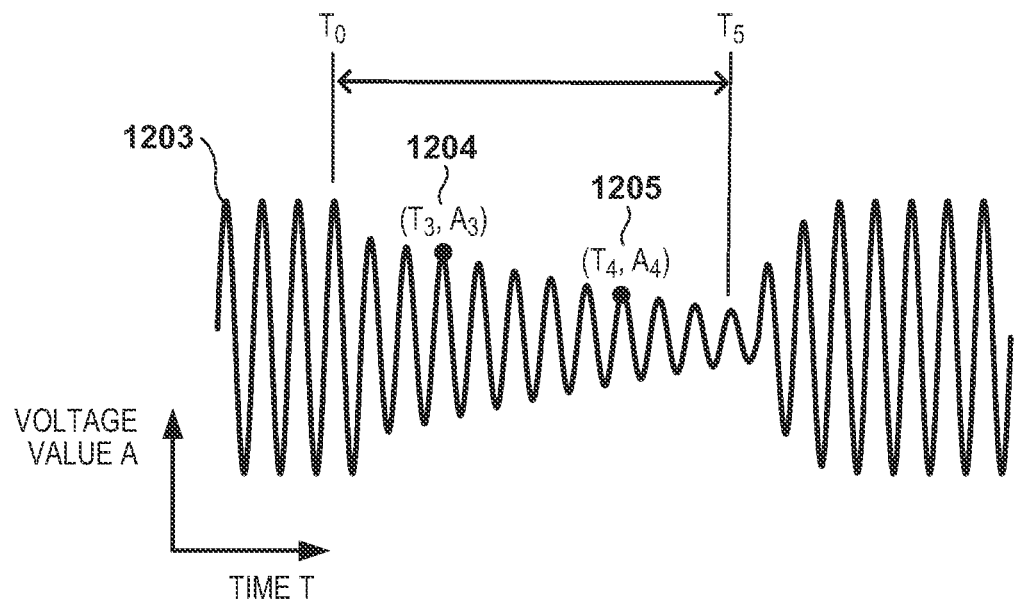
FIG. 12B is a view for explaining a Q factor measuring method in a time domain.

A Q factor measuring method in a time domain will be described with reference to FIGS. 12A and 12B. FIGS. 12A and 12B are conceptual views for explaining a method of measuring a Q factor in a time domain (second Q factor measurement). In this embodiment, a foreign object detection method based on the second Q factor will be referred to as a third foreign object detection method. The second Q factor measurement is performed by the second Q factor measurement unit 401. Also, control of transmission power by the power transmission unit 302 of the power transmission apparatus 100 is performed by the power transmission control unit 406. In the second Q factor measurement, the power transmission apparatus 100 and the power reception apparatus 102 turn on the switches in the same period to instantaneously disconnect power transmission so the received power is not supplied to the loads. According to this, for example, the voltage applied to the coil gradually decreases. The second Q factor is calculated based on how the voltage decreases.

A waveform 1200 shown in FIG. 12A represents the elapsed time of the value of a high-frequency voltage (to be simply referred to as "the voltage value of the power transmission coil" hereinafter) applied to the power transmission coil 303 of the power transmission apparatus 100 or a terminal portion of the resonant capacitor 306. Note that in FIGS. 12A and 12B, the abscissa represents time, and the ordinate represents the voltage value. At time $T_0$, application of the high-frequency voltage (power transmission) is stopped. A point 1201 is a point on the envelope of the high-frequency voltage, and represents the high-frequency voltage at time $T_1$. In FIG. 12A, $(T_1, A_1)$ represents that the voltage value at time $T_1$ is $A_1$. Similarly, a point 1202 is a point on the envelope of the high-frequency voltage, and represents the high-frequency voltage at time $T_2$. In FIG. 12A, $(T_2, A_2)$ represents that the voltage value at time $T_2$ is $A_2$.

Q factor measurement is executed based on the time-rate change of the voltage value from time $T_0$. For example, based on the times and the voltage values of the points 1201 and 1202 as the envelope of the voltage value, and an angular velocity ω (ω=2πf, f is the operating frequency of the high-frequency voltage) of the high-frequency voltage, the Q factor is calculated by $$Q = \frac{\omega(t_2 - t_1)}{2\ln\left(\frac{A_1}{A_2}\right)} \quad (1)$$

Next, processing of the power transmission apparatus 100 measuring the Q factor in the time domain in this embodiment will be described next with reference to FIG. 12B. A waveform 1203 represents the value of a high-frequency voltage applied to the power transmission coil 303, and its frequency falls within the range of 110 kHz to 148.5 kHz, which is used in the Qi standard. Also, each of points 1204 and 1205 is a part of the envelope of the voltage value. The power transmission unit 302 of the power transmission apparatus 100 stops power transmission in the section from time $T_0$ to $T_5$. The second Q factor measurement unit 401 of the power transmission apparatus 100 measures the Q factor based on a voltage value $A_3$ (point 1204) at time $T_3$, a voltage value $A_4$ (point 1205) at time $T_4$, the operating frequency of the high-frequency voltage, and equation (1). Note that the power transmission unit 302 of the power transmission apparatus 100 resumes power transmission at time $T_5$. As described above, the second Q factor measurement is performed by the power transmission apparatus 100 instantaneously disconnecting power transmission, and measuring the Q factor based the elapsed times and the voltage values, and the operating frequency.

Note that in the third foreign object detection method, measuring $(T_3, A_3)$ and $(T_4, A_4)$ suffices, and the second Q factor need not be measured. That is, as shown in equation (1), an index based on the value of $(T_4-T_3)$ and the value of the ratio of $A_4$ to $A_3$ ($A_4/A_3$) or the ratio of $A_3$ to $A_4$ ($A_3/A_4$) may be used to detect the presence/absence of a foreign object. More specifically, the index is compared with a threshold, thereby detecting the presence/absence of a foreign object.

Also, in the third foreign object detection method, a current value may be measured in place of the voltage value, and an index based on the ratio of current values may be used to detect the presence/absence of a foreign object. That is, the current value at $T_3$ and the current value at time $T_4$ are measured. The second Q factor may be obtained based on the current value.

(Operations of Conventional Power Transmission Apparatus and Power Reception Apparatus)

Figure 6:
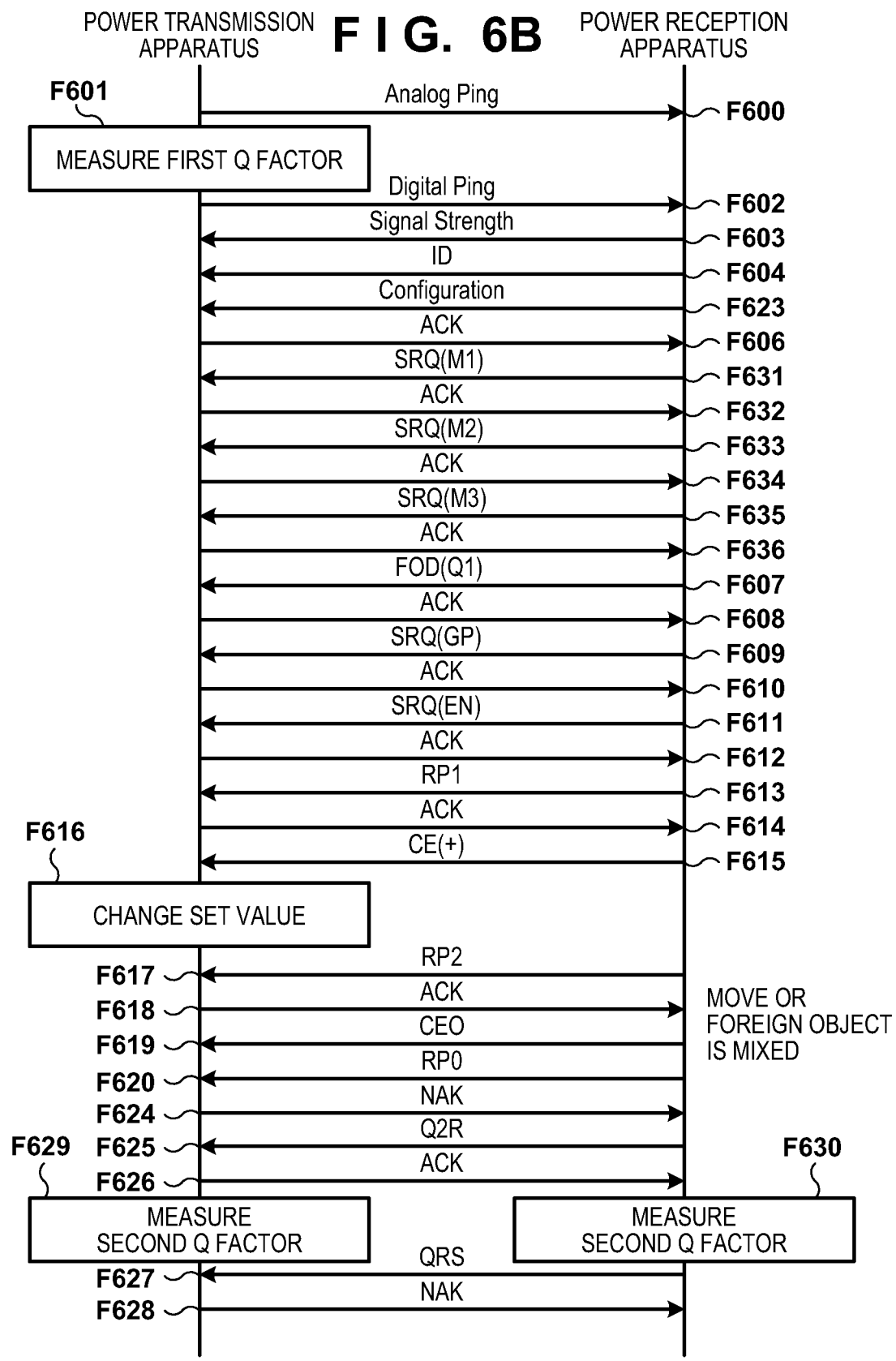
FIG. 6A is a sequence chart showing an example of the procedure of processing executed by a conventional power transmission apparatus and a conventional power reception apparatus.
FIG. 6B is a sequence chart showing an example of the procedure of processing executed by a power transmission apparatus and a power reception apparatus according to the embodiment.

The operations of the conventional power transmission apparatus 100 and the conventional power reception apparatus 102 will be described with reference to FIG. 6A. In the description of FIG. 6A, it is assumed that the power transmission apparatus 100 and the power reception apparatus 102 are a power transmission apparatus and a power reception apparatus, which comply with the WPC standard v1.2.3.

The power transmission apparatus 100 transmits an Analog Ping to detect an object existing near the power transmission coil 303 (F600). The Analog Ping is pulse-shaped power, and is power used to detect an object. Even if the power reception apparatus 102 receives the Analog Ping, this power is too small to activate the control unit 200. By the Analog Ping, the power transmission apparatus 100 detects an object based on a shift of the resonance frequency of the voltage value in the power transmission coil 303, which is caused by an object existing near the power transmission coil 303, or a change of the voltage value/current value flowing to the power transmission coil 303. Upon detecting an object by the Analog Ping, the power transmission apparatus 100 measures the Q factor of the power transmission coil 303 by the above-described first Q factor measurement (F601). Next to the first Q factor measurement, the power transmission apparatus 100 starts transmission of a Digital Ping (F602). The Digital Ping is power used to activate the control unit 200 of the power reception apparatus 102, and is power larger than the Analog Ping. The Digital Ping is transmitted continuously from then on. That is, the power transmission apparatus 100 continuously transmits power equal to or larger than the Digital Ping after the start of transmission of the Digital Ping (F602) until reception of an EPT (End Power Transfer) packet from the power reception apparatus 102 (F622).

When activated by receiving the Digital Ping, the power reception apparatus 102 stores the voltage value of the received Digital Ping in a Signal Strength packet and transmits it to the power transmission apparatus 100 (F603). Next, the power reception apparatus 102 transmits an ID packet storing an ID including the version information of the WPC standard with which the power reception apparatus 102 complies and device identification information (F604) to the power transmission apparatus 100. Furthermore, the power reception apparatus 102 transmits, to the power transmission apparatus 100, a Configuration packet including information such as the maximum value of power to be supplied from the voltage control unit 203 to the load (power charging unit 205) (F605). The power transmission apparatus 100 receives the ID packet and the Configuration packet. Upon determining based on these packets that the power reception apparatus 102 supports an extension protocol (including Negotiation to be described later) after the WPC standard v1.2, the power transmission apparatus 100 responds by an ACK (F606).

The power reception apparatus 102 receives the ACK and transits to a Negotiation phase to negotiate about power to be transmitted/received. First, the power reception apparatus 102 transmits an FOD Status packet to the power transmission apparatus 100 (F607). In this embodiment, the FOD Status packet will be referred to as "FOD(Q1)". The power transmission apparatus 100 performs foreign object detection by the first foreign object detection method based on the Q factor stored in the received FOD(Q1) (the Q factor measured in the frequency domain) and the Q factor measured by the first Q factor measurement. Upon determining that the possibility of absence of a foreign object is high, the power transmission apparatus 100 transmits an ACK representing the determination result to the power reception apparatus 102 (F608).

Upon receiving the ACK, the power reception apparatus 102 negotiates about Guaranteed Power (GP) that is the maximum value of the power value that the power reception apparatus 102 requests to receive. The Guaranteed Power represents the load power of the power reception apparatus 102 (power to be consumed by the battery 206), which is agreed between the power transmission apparatus 100 and the power reception apparatus 102. This negotiation is implemented by transmitting, to the power transmission apparatus 100, a packet storing the value of Guaranteed Power requested by the power reception apparatus 102 in a Specific Request defined by the WPC standard (F609). In this embodiment, the packet will be referred to as "SRQ (GP)". The power transmission apparatus 100 responds to the SRQ(GP) in consideration of the power transmission capability of its own, and the like. Upon judging that the Guaranteed Power is acceptable, the power transmission apparatus 100 transmits an ACK representing that the request is accepted (F610). In this embodiment, assume that the power reception apparatus 102 requests 15 W as the Guaranteed Power by SRQ(GP). If negotiation of a plurality of parameters including Guaranteed Power is ended, the power reception apparatus 102 transmits, to the power transmission apparatus, "SRQ(EN)" that requests the end of negotiation (End Negotiation) in the Specific Request (F611). The power transmission apparatus 100 transmits an ACK to the SRQ(EN) (F612), ends the negotiation, and transits to a Power Transfer phase to transmit/receive power defined by the Guaranteed Power.

Next, the power transmission apparatus 100 executes foreign object detection (second foreign object detection method) based on the above-described power loss method. First, the power transmission apparatus 100 receives RP1 from the power reception apparatus 102 (F613). The power transmission apparatus 100 accepts, as a Calibration data Point (corresponding to the point 1100 in FIG. 11), the received power value stored in the RP1 and the transmission power value of the power transmission apparatus 100 when the received power value is obtained. The power transmission apparatus 100 transmits an ACK representing the acceptance of the Calibration data Point to the power reception apparatus 102 (F614).

After reception of the ACK, the power reception apparatus 102 transmits, to the power transmission apparatus 100, Control Error (to be expressed as CE hereinafter) that requests the power transmission apparatus 100 to increase/decrease the received voltage (or received current or received power). The CE stores a sign and a numerical value. If the sign is plus, it means that the power is requested to be increased. If the sign is minus, it means that the power is requested to be decreased. If the numerical value is zero, it means that the power is requested to be maintained. Here, the power reception apparatus 102 transmits CE(+) representing that the power is increased to the power transmission apparatus 100 (F615).

Upon receiving CE(+), the power transmission apparatus 100 changes the set value of the power transmission unit 302 to increase the transmission power (F616). When the received power increases in response to CE(+), the power reception apparatus 102 supplies the received power to the loads (the power charging unit 205 and the battery 206), and transmits the RP2 to the power transmission apparatus 100 (F617). The power transmission apparatus 100 accepts, as a Calibration data Point (corresponding to the point 1101 in FIG. 11), the received power value stored in the RP2 and the transmission power value of the power transmission apparatus 100 at that time. The power transmission apparatus 100 transmits an ACK representing the acceptance of the Calibration data Point to the power reception apparatus 102 (F618). Since the power transmission apparatus 100 has obtained the two Calibration data Points (the points 1100 and 1101 in FIG. 11) at this point of time, a Calibration curve (the line 1102 in FIG. 11) can be derived.

The power transmission apparatus 100 and the power reception apparatus 102 have transited to the Power Transfer phase at this point of time, and the power transmission apparatus 100 is transmitting the power that enables the power reception apparatus 102 to receive the maximum power of 15 W negotiated in the Negotiation phase. The power reception apparatus 102 periodically transmits, to the power transmission apparatus 100, a CE that requests the power transmission apparatus 100 to maintain the transmission power and the RP0 storing the current received power value (F619 and F620). Upon receiving the RP0 from the power reception apparatus 102, the power transmission apparatus 100 performs foreign object detection based on the above-described second foreign object detection method. Upon determining, as the result of foreign object detection, that the possibility of absence of a foreign object is high, the power transmission apparatus 100 transmits an ACK to the power reception apparatus 102 (F621). After that, if power charging to the battery 206 is ended, the power reception apparatus 102 transmits an EPT (End Power Transfer) packet that requests stop of power transmission to the power transmission apparatus 100 (F622).

In the above-described way, wireless power transfer is performed
between the power transmission apparatus 100 and the power reception apparatus 102, which comply with the WPC standard v1.2.3.

As shown in the processing example of FIG. 6A, foreign object detection by the power loss method is performed during the Power Transfer phase. However, if only one foreign object detection method is used, the possibility of a detection error in which a foreign object is detected regardless of the absence of a foreign object, or conversely, the possibility of a determination error in which although a foreign object exists, it is determined that no foreign object exists remains to some extent. On the other hand, if foreign object detection is executed by combining a plurality of foreign object detection methods, the accuracy of foreign object detection can be expected to improve. In particular, the Power Transfer phase is a phase in which the TX performs power transmission. If a foreign object exists between the TX and the RX during power transmission, heat generated from the foreign object increases. Note that even if the foreign object exists not between the TX and the RX but within the transmission enable range, it receives power and generates heat. For this reason, in this phase, a large advantage can be obtained by executing a plurality of foreign object detection methods and improving the foreign object detection accuracy. In this embodiment, in the Power Transfer phase, a foreign object detection method different from the power loss method is introduced.

Here, in foreign object detection (first foreign object detection method) based on a Q factor (first Q factor) measured in the frequency domain, the frequency is swept to search for a resonance frequency every time the measurement is performed. If such sweeping is executed when the power transmission apparatus 100 is transmitting relatively large power for the Digital Ping or the Power Transfer phase, switching noise in the power transmission unit 302 may increase. On the other hand, foreign object detection (third foreign object detection method) based on a Q factor (second Q factor) measured in the time domain can be executed using a single frequency, and the frequency need not be swept. For this reason, the method can be executed at the operating frequency during power transmission for the Digital Ping or the Power Transfer phase, and the influence on switching noise is little. In this embodiment, in the second Q factor measurement, control is performed to, when the power transmission apparatus stops power transmission, turn on the switch 208 and form a closed circuit including the power reception coil 201 and the resonant capacitor 207. In a state in which the influence of the variation of the loads in the power reception apparatus 102 is thus removed, the second Q factor is measured.

When applying the third foreign object detection method to the WPC standard, the apparatus configuration of the power reception apparatus 102 is assumed to take various modes. For this reason, the power transmission apparatus 100 needs to appropriately control processing to be performed in accordance with the capability of the power reception apparatus 102. For example, if the power transmission apparatus 100 executes second Q factor measurement for the power reception apparatus 102 that cannot perform control to form a closed circuit, the measurement is affected by the variation of the loads in the power reception apparatus 102, and the Q factor cannot correctly be measured. The measurement of the second Q factor can also be assumed to be executed on the side of the power reception apparatus 102. However, if the capability of the power reception apparatus 102 is unknown, the power transmission apparatus 100 cannot determine whether to perform measurement of the second Q factor in the self-apparatus. For example, if the power reception apparatus 102 can form the closed circuit but cannot execute measurement of the second Q factor, the presence/absence of a foreign object cannot be determined unless the power transmission apparatus 100 measures the second Q factor. Similarly, if the capability of the power reception apparatus 102 is unknown, the power transmission apparatus 100 cannot determine whether to receive the measurement result of the second Q factor from the power reception apparatus 102. For example, if the power reception apparatus 102 cannot execute measurement of the second Q factor, but the power transmission apparatus 100 is going to receive the measurement result from the power reception apparatus 102, an unnecessary wait time is generated. On the other hand, if the power reception apparatus 102 can measure the second Q factor, but the power transmission apparatus 100 does not receive the measurement result from the power reception apparatus 102, a state deviation occurs between the power transmission apparatus 100 and the power reception apparatus 102. Hence, in this embodiment, a control method for appropriately applying the third foreign object detection method based on measurement of the second Q factor to the WPC standard is used. The control method will be described below.

(Description of Operation in a Case where Third Foreign Object Detection Method is Applied to WPC Standard)

FIG. 6B shows an example of the procedure of processing executed by the power transmission apparatus 100 and the power reception apparatus 102 according to this embodiment. Note that the same numbers as in FIG. 6A denote the same processes, and a description thereof will be omitted. After execution of the processes of F600 to F604, the power reception apparatus 102 transmits a Configuration Packet to the power transmission apparatus 100 (F623). In this embodiment, the capability information of the power reception apparatus 102 is notified to the power transmission apparatus 100 by the Configuration Packet. In this embodiment, as the capability information to be notified, a Short Ability bit and a Measure Ability bit are defined in the Configuration Packet. The Short Ability bit is information representing whether the power reception apparatus 102 can perform control to form a closed circuit including the power reception coil 201 and the resonant capacitor 207 for second Q factor measurement. For example, if the self-apparatus has the capability of forming a closed circuit for second Q factor measurement, the power reception apparatus 102 stores "1" in the Short Ability bit. Otherwise, "0" is stored. The Measure Ability bit is information representing whether the power reception apparatus 102 can execute measurement of the second Q factor of the power reception circuit. For example, if the self-apparatus has the capability of measuring the second Q factor of the power reception circuit, the power reception apparatus 102 stores "1" in the Measure Ability bit. Otherwise, "0" is stored. Note that these pieces of information can be information representing whether the power reception apparatus 102 can execute predetermined processing associated with foreign object determination based on second Q factor measurement executed by the power transmission apparatus 100. That is, whether a closed circuit can be formed or whether measurement of the second Q factor of the power reception circuit can be executed, is merely a kind of predetermined processing, and an information bit concerning processing other than these may be transmitted from the power reception apparatus 102 to the power transmission apparatus 100.

FIG. 13 shows the configuration of a Configuration Packet of the WPC standard v1.2.3. Note that a description of portions that are not associated with this embodiment will be omitted here. The Configuration Packet of the WPC standard v1.2.3 includes a plurality of Reserved regions. That is, a region 1300 from bit0 to bit7 of Bank1, a region 1301 from bit4 to bit6 of Bank2, and a region 1302 from bit0 to bit2 of Bank4 are Reserved regions. In this embodiment, as an example, the Short Ability bit is arranged in bit2 of Bank4, and the Measure Ability bit is arranged in bit1 of Bank4. Note that these bits may be arranged in another Reserved region. In place of these bits, information representing the version of the WPC standard, and the like may be arranged in the Reserved region. In this case, the version can indicate whether the power reception apparatus 102 can perform control to form a closed circuit including the power reception coil 201 and the resonant capacitor 207 for second Q factor measurement and whether the power reception apparatus 102 can execute measurement of the second Q factor of the power reception circuit. For example, it can be defined that in a future version of the WPC standard, it is essential that the power reception apparatus 102 complying with the version has these functions. In this case, if the version information of the power reception apparatus 102 is notified by the Configuration Packet, the power transmission apparatus 100 can specify whether the power reception apparatus 102 has these functions. Note that in the WPC standard v1.2.3, all the bits of the above-described Reserved regions are 0. In addition, the power transmission apparatus 100 that cannot use the third foreign object detection method neglects values stored in these Reserved regions.

Note that a case where the Short Ability bit and the Measure Ability bit are set in the Configuration Packet and transmitted from the power reception apparatus 102 to the power transmission apparatus 100 will be described here. However, the present disclosure is not limited to this. For example, these pieces of information may be included in a new packet that is not defined by the WPC standard and transmitted/received. Alternatively, these pieces of information may be included in another packet defined by the WPC standard and transmitted/received.

In this embodiment, assume that the power reception apparatus 102 can perform control to form a closed circuit including the power reception coil 201 and the resonant capacitor 207 for second Q factor measurement, and the power reception apparatus 102 can execute measurement of the second Q factor of the power reception circuit. Hence, in F623, the power reception apparatus 102 transmits a Configuration Packet in which "1" is set in the Short Ability bit, and "1" is set in the Measure Ability bit as well. The power transmission apparatus 100 refers to the Short Ability bit and the Measure Ability bit included in the received Configuration Packet and stores these values in the memory 305.

After reception of the Configuration Packet, the power transmission apparatus 100 responds by an ACK (F606). Upon receiving the ACK to the Configuration Packet, the power reception apparatus 102 transits to the Negotiation phase. In the Negotiation phase, the power transmission apparatus 100 and the power reception apparatus 102 make a negotiation about third foreign object detection. In second Q factor measurement, the power reception apparatus 102 makes a negotiation of a measurement start time that is the time until the power transmission unit 302 of the power transmission apparatus 100 stops power transmission. This negotiation is done by the power reception apparatus 102 transmitting, of the Specific Request defined by the WPC standard, a packet storing the requested measurement start time to the power transmission apparatus 100 (F631). The power reception apparatus 102 decides the value of the requested measurement start time based on the processing capability of its own, and transmits a packet storing the value of the measurement start time to the power transmission apparatus 100. Here, this packet will be referred to as "SRQ(M1)". The power transmission apparatus 100 responds to SRQ(M1) in consideration of the processing capability of the self-apparatus. Upon determining that the measurement start time of the value indicated by SRQ(M1) can be accepted, the power transmission apparatus 100 transmits an ACK. Upon determining that the measurement start time cannot be accepted, the power transmission apparatus 100 transmits an NAK. Here, assume that the power transmission apparatus 100 determines that the measurement start time can be accepted, and transmits an ACK (F632). Note that here, as an example, assume that the power reception apparatus 102 requests 50 ms as the Q factor measurement start time in SRQ(M1).

The power reception apparatus 102 negotiates about a Window length that is the length of the section (the section from time $T_0$ to time $T_5$) in which the power transmission unit 302 of the power transmission apparatus 100 stops power transmission in second Q factor measurement. This negotiation is done by the power reception apparatus 102 transmitting, of the Specific Request defined by the WPC standard, a packet storing the requested value of the Window length to the power transmission apparatus 100 (F633). Here, this packet will be referred to as "SRQ(M2)". The power reception apparatus 102 decides the value of the Window length based on the processing capability of the self-apparatus, and transmits a packet storing the decided value of the Window length to the power transmission apparatus 100. The power transmission apparatus 100 responds to SRQ(M2) in consideration of the processing capability of the self-apparatus. Upon determining that the Window length of the value indicated by SRQ(M2) can be accepted, the power transmission apparatus 100 transmits an ACK. Upon determining that the Window length cannot be accepted, the power transmission apparatus 100 transmits an NAK. Here, assume that the power transmission apparatus 100 determines that the Window length can be accepted, and transmits an ACK (F634). Note that here, as an example, assume that the power reception apparatus 102 requests 100 ms as the Window length in SRQ(M2).

Also, the power reception apparatus 102 negotiates about a timeout length that is the time during which the power transmission apparatus 100 accepts, from the power reception apparatus 102, the Q factor measured by the power reception apparatus 102 in second Q factor measurement. This negotiation is done by the power reception apparatus 102 transmitting, of the Specific Request defined by the WPC standard, a packet storing the requested value of the timeout length to the power transmission apparatus 100 (F635). Here, this packet will be referred to as "SRQ(M3)". The power reception apparatus 102 decides the value of the timeout length based on the processing capability of the self-apparatus, and transmits a packet storing the decided value of the timeout length to the power transmission apparatus 100. The power transmission apparatus 100 responds to SRQ(M3) in consideration of the processing capability of the self-apparatus. Upon determining that the timeout length can be accepted, the power transmission apparatus 100 transmits an ACK. Upon determining that the timeout length cannot be accepted, the power transmission apparatus 100 transmits an NAK. Here, assume that the power transmission apparatus 100 judges that the timeout length can be accepted, and transmits an ACK (F636). In this embodiment, assume that the power reception apparatus 102 requests 500 ms as the timeout length in SRQ(M3).

Here, in an example, of the Specific Request, Types that are not defined by v1.2.3 can be assigned to the negotiations of the measurement start time, the window length, and the timeout length. Measure Delay Req is a packet that requests the power transmission apparatus 100 to change the measurement start time. Window Length Req is a packet that requests the power transmission apparatus 100 to change the Window length. Timeout Req is a packet that requests the power transmission apparatus 100 to change the timeout length. These three packets are Reserved Packets whose packet type is not defined by the WPC standard v1.2.3. In this embodiment, of these Reserved packets, a packet whose packet header is 0×40 is defined as the Measure Delay Req packet. Similarly, a packet whose packet header is 0×41 is defined as the Window Length Req packet, and a packet whose packet header is 0×42 is defined as the Timeout Req packet.

Alternatively, of the packets defined by the WPC standard v1.2.3, not the Specific Request or General Request but packets whose type is not defined may be defined as the above-described three packets. For example, not the Specific Request or General Request but a Reserved Packet or a Proprietary Packet whose Packet type is undefined can be defined as the above-described three packets. Also, of the General request or Specific Request defined by the WPC standard v1.2.3, packets whose Packet type is undefined may be defined as the above-described three packets. That is, of the General request or Specific Request, a Reserved Packet or a Proprietary Packet whose Packet type is undefined can be defined as the above-described three packets.

Referring back to FIG. 6B, if the processes from F607 to F612 are executed in the Negotiation phase, the Negotiation phase is ended, and the phase transits to the Power Transfer phase. In the Power Transfer phase, the above-described processes from F613 to F617 are executed. Here, assume that immediately after the power reception apparatus 102 receives the Analog Ping in F618, a foreign object is placed on the Operating Volume. The power reception apparatus 102 transmits, to the power transmission apparatus 100, the CE that requests the power transmission apparatus 100 to maintain the transmission power and the RP0 that stores the current received power value (F619 and F620).

Upon receiving the RP0 from the power reception apparatus 102, the power transmission apparatus 100 performs foreign object detection based on the above-described second foreign object detection method. The power transmission apparatus 100 determines, as the result of foreign object detection, that the possibility of presence of a foreign object is high, and transmits an NAK to the power reception apparatus 102 (F624). Upon receiving the NAK from the power transmission apparatus 100, to more specifically measure the presence/absence of a foreign object, the power reception apparatus 102 transmits, to the power transmission apparatus 100 a Q2R that is a packet for requesting the start of third foreign object detection (F625). The Q2R packet is a packet in which, for example, a value indicating the Q2R packet is set in the Reserved bit of the Reserved Power packet in the WPC standard. However, the present disclosure is not limited to this. For example, the power reception apparatus 102 may request the start of third foreign object detection using the mode of an undefined Reserved Power packet, or may request the start of third foreign object detection by defining a new packet. In this embodiment, a case where the power reception apparatus 102 requests the start of third foreign object detection using the Q2R packet has been described. However, third foreign object detection may be started based on an NAK response to the RP2 without using the Q2R packet.

Upon receiving the Q2R, the power transmission apparatus 100 determines whether to execute third foreign object detection. Upon determining to execute, the power transmission apparatus 100 transmits an ACK to the power reception apparatus 102. Upon determining not to execute, the power transmission apparatus 100 transmits an NAK to the power reception apparatus 102. Here, assume that the power transmission apparatus 100 determines to execute third foreign object detection. In this case, the power transmission apparatus 100 transmits an ACK to the power reception apparatus 102 (F626). If transmission of the ACK is completed, the power transmission apparatus 100 and the power reception apparatus 102 start third foreign object detection. In the third foreign object detection, the power transmission apparatus 100 and the power reception apparatus 102 measure the second Q factor (F629 and F630). After measurement of the second Q factor, the power reception apparatus 102 stores the second Q factor measured by the self-apparatus in a packet (QRS) and transmits the QRS to the power transmission apparatus 100 (F627). Note that the QRS is a packet including at least the second Q factor measured by the power reception apparatus 102, but may include other information such as the current received power value. Upon receiving the QRS from the power reception apparatus 102, the power transmission apparatus 100 determines the presence/absence of a foreign object based on the received second Q factor of the power reception apparatus 102 and the second Q factor measured by the self-apparatus. It is possible to more accurately judge the presence/absence of a foreign object by determining the presence/absence of a foreign object using the second Q factor measured by the power reception apparatus 102 in addition to the second Q factor measured by the power transmission apparatus 100. Upon determining that a foreign object exists, the power transmission apparatus 100 transmits an NAK to the power reception apparatus 102. Upon determining that a foreign object does not exist, the power transmission apparatus 100 transmits an ACK to the power reception apparatus 102. Here, assume that the power transmission apparatus 100 determines that a foreign object exists. In this case, the power transmission apparatus 100 transmits an NAK to the power reception apparatus 102 (F628). After that, the power transmission apparatus 100 stops power transmission.

(Procedure of Third Foreign Object Detection Processing by Power Transmission Apparatus 100)

An example of the procedure of third foreign object detection processing by the power transmission apparatus 100 will be described next with reference to FIG. 7. After the third foreign object detection request is received, the power transmission apparatus 100 determines whether the power reception apparatus 102 can perform control to form a closed circuit including the power reception coil 201 and the resonant capacitor 207 for second Q factor measurement (step S701). The power transmission apparatus 100, for example, refers to the Short Ability bit stored in the memory in the Configuration phase. If the value is 1, the power transmission apparatus 100 determines that the control is possible (YES in step S701), and advances the process to step S702. On the other hand, if the value of the Short Ability bit is 0, the power transmission apparatus 100 determines that the control is not possible (NO in step S701), transmits an NAK (step S708), and ends the processing.

In step S702, the power transmission apparatus 100 determines whether the power reception apparatus 102 can execute measurement of the second Q factor of the power reception circuit. The power transmission apparatus 100, for example, refers to the Measure Ability bit stored in the memory in the Configuration phase. If the value is 0, the power transmission apparatus 100 determines that the measurement of the second Q factor is not possible (NO in step S702), and advances the process to step S709. Then, the power transmission apparatus 100 measures the second Q factor in the self-apparatus (step S709), and advances the process to step S706. On the other hand, if the value of the Measure Ability bit is 1, the power transmission apparatus 100 determines that the measurement of the second Q factor is possible (YES in step S702), and the advances the process to step S703.

In step S703, the power transmission apparatus 100 determines whether to measure the second Q factor of the power transmission circuit by the self-apparatus. Upon determining to measure the second Q factor by the self-apparatus (YES in step S703), the power transmission apparatus 100 executes the measurement of the second Q factor (step S704), and the advances the process to step S705. On the other hand, upon determining not to measure the second Q factor by the self-apparatus (NO in step S703), the power transmission apparatus 100 advances the process to step S705 without executing the measurement of the second Q factor. In step S705, the power transmission apparatus 100 receives the second Q factor from the power reception apparatus, and advances the process to step S706. At this time, if the second Q factor cannot be received from the power reception apparatus after the ACK is transmitted in F626 until the timeout length time elapses, the power transmission apparatus 100 ends the processing and stops power transmission. By setting the timeout length, if the second Q factor is not sent from the power reception apparatus 102, the processing can appropriately be advanced or stopped. Also, at this time, if the appropriate timeout length according to the processing capability of the power reception apparatus 102 is decided and set by the negotiation, as described above, even the power reception apparatus 102 with a low processing capability can complete transmission of the second Q factor until timeout.

In step S706, the power transmission apparatus 100 determines the presence/absence of a foreign object using at least one of the second Q factor measured in step S704 and the second Q factor received in step S705. Upon determining that a foreign object exists (YES in step S706), the power transmission apparatus 100 transmits an NAK to the power reception apparatus 102 (step S708). On the other hand, upon determining that a foreign object does not exist (NO in step S706), the power transmission apparatus 100 transmits an ACK to the power reception apparatus 102 (step S707), and ends the processing.

In the processing example described with reference to FIG. 7, in step S701, the power transmission apparatus 100 confirms that the value of the Short Ability bit is 1, determines that the power reception apparatus 102 can execute control to form the closed circuit, and advances the process to step S702. In step S702, the power transmission apparatus 100 confirms that the value of the Measure Ability bit is 1, determines that the power reception apparatus 102 can measure the second Q factor, and advances the process to step S703. In step S703, the power transmission apparatus 100 decides to measure the second Q factor by the self-apparatus as well, and advances the process to step S704. The power transmission apparatus 100 measures the second Q factor by the self-apparatus in step S704, receives the second Q factor measured by the power reception apparatus 102 in step S705, and advances the process to step S706. Next, in step S706, using the second Q factor received from the power reception apparatus 102 and the second Q factor measured by the self-apparatus, the power transmission apparatus 100 judges that a foreign object exists. In step S708, the power transmission apparatus 100 transmits an NAK to the power reception apparatus 102, and ends the processing.

Figure 7:
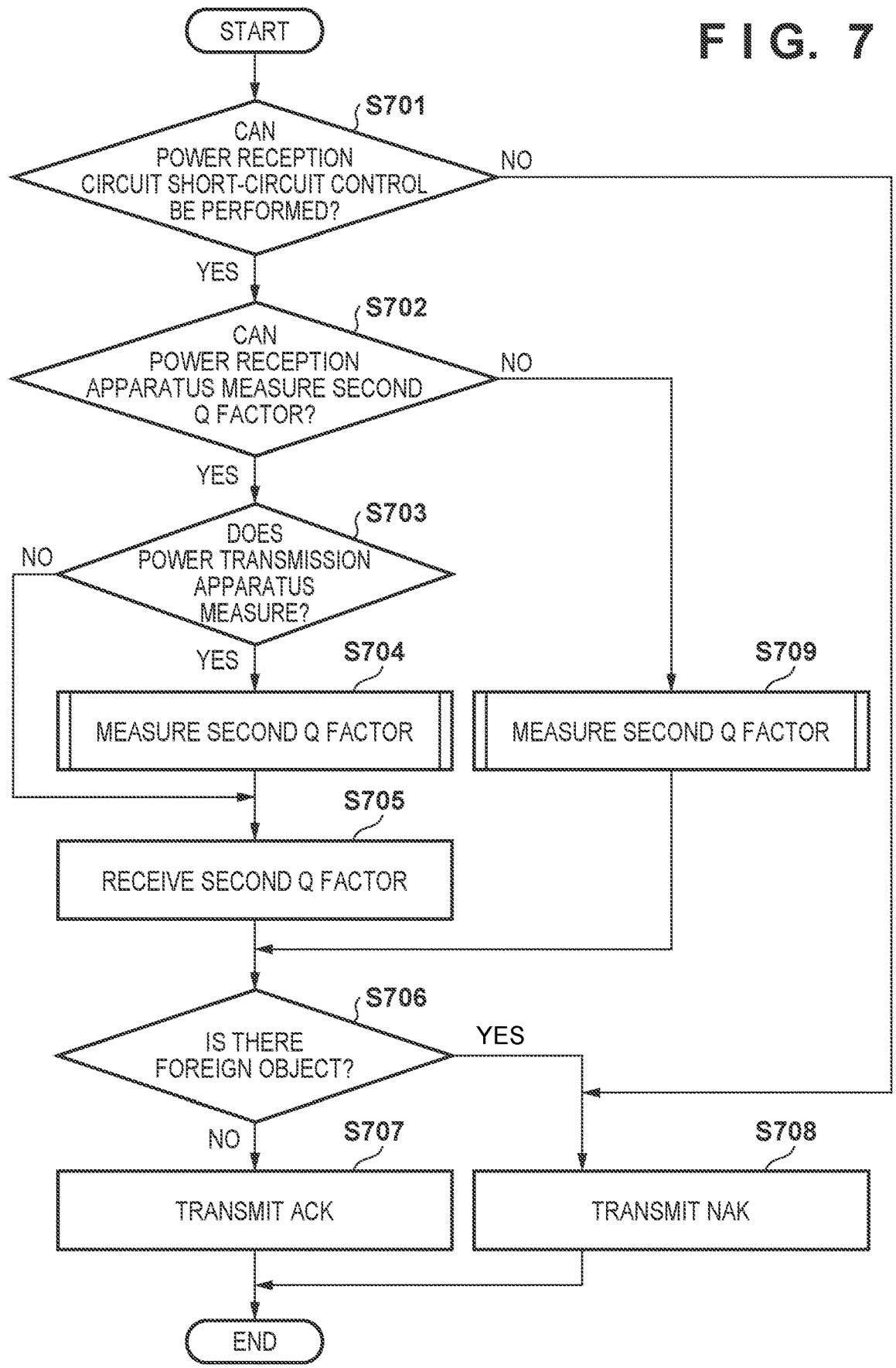
FIG. 7 is a flowchart showing an example of the procedure of third foreign object detection processing by the power transmission apparatus.

In the processing shown in FIG. 7, in step S701, the power transmission apparatus 100 determines whether the power reception apparatus 102 can execute control to form a closed circuit, thereby preventing the power reception apparatus 102 incapable of executing such control from measuring the second Q factor. As a result, the power transmission apparatus 100 can prevent wrong control from being executed by measuring the Q factor under inappropriate conditions.

Note that in this embodiment, upon determining in step S701 that the power reception apparatus 102 cannot execute control to form a closed circuit, the power transmission apparatus 100 transmits a NAK and ends the processing. However, the present disclosure is not limited to this. For example, the power transmission apparatus 100 may measure the second Q factor in a state in which the power reception apparatus 102 does not form the closed circuit, and determine the presence/absence of a foreign object based on the measured second Q factor. However, if the second Q factor is measured in a state in which the closed circuit is not formed, the measured value is assumed to be affected by the variation of the loads in the power reception apparatus. For this reason, if such second Q factor measurement is used, the presence/absence of a foreign object is determined using a criterion different from the determination criterion for the presence/absence of a foreign object based on the measurement result of the second Q factor in a case where a closed circuit can be formed.

Also, in step S702, the power transmission apparatus 100 determines whether the power reception apparatus 102 has a capability of performing measurement of the second Q factor of the power transmission circuit. Hence, the power transmission apparatus 100 can prevent the procedure of foreign object detection from failing because the self-apparatus does not measure the second Q factor although the power reception apparatus 102 cannot measure the second Q factor. In addition, the power transmission apparatus 100 can be prevented from unnecessarily waiting for transmission of the measurement result of the second Q factor from the power reception apparatus 102 although the power reception apparatus 102 cannot measure the second Q factor. Also, the power transmission apparatus 100 can prevent a state deviation from occurring in a case where the power reception apparatus 102 can measure the second Q factor, and the power transmission apparatus 100 does not receive the second Q factor transmitted from the power reception apparatus 102.

Furthermore, in step S704, the power transmission apparatus 100 measures the second Q factor by the self-apparatus as well in addition to the power reception apparatus 102, thereby performing accurate foreign object detection with little influence of noise. Also, in step S703, the power transmission apparatus 100 decides not to measure the second Q factor by the self-apparatus, thereby omitting second Q factor measurement by the self-apparatus and determining a foreign object using the second Q factor received from the power reception apparatus 102. This can suppress unnecessary measurement, which occurs because the power transmission apparatus 100 and the power reception apparatus 102 simultaneously measure the Q factor.

(Procedure of Third Foreign Object Detection Processing by Power Reception Apparatus 102)

Figure 8:
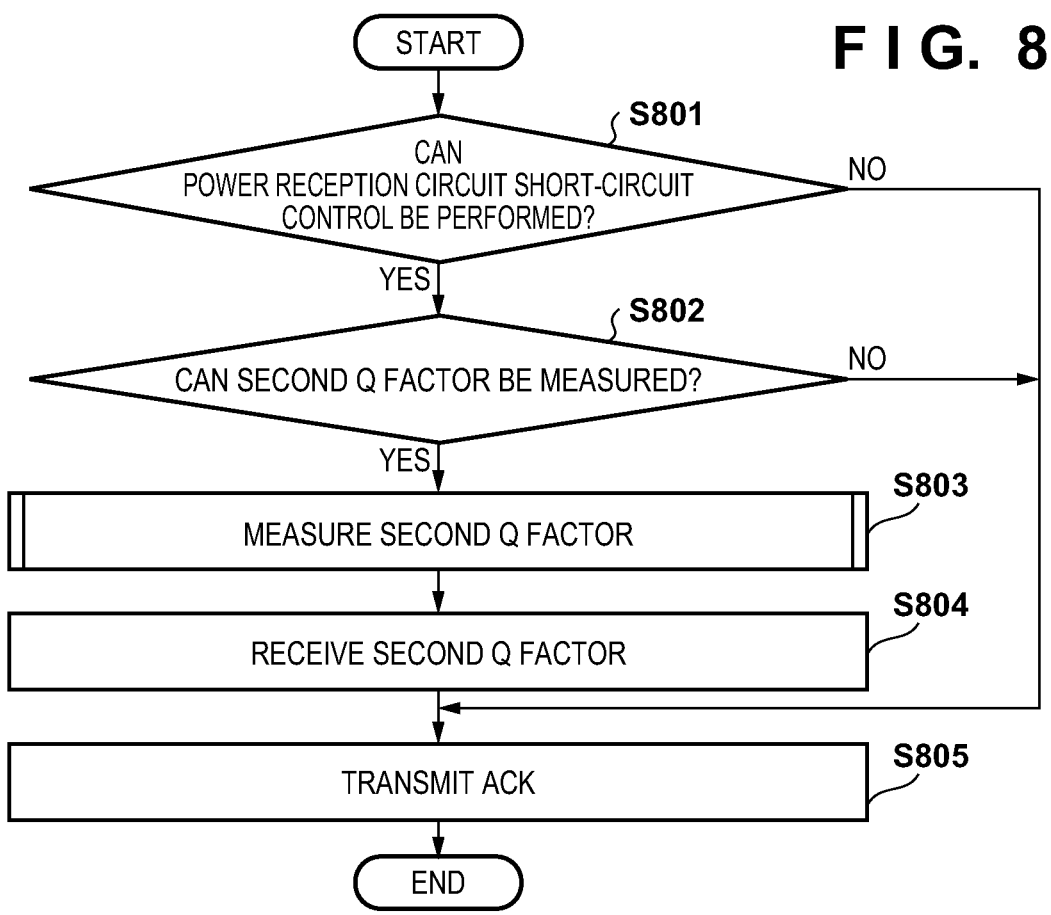
FIG. 8 is a flowchart showing an example of the procedure of third foreign object detection processing by the power reception apparatus.

An example of the procedure of third foreign object detection processing by the power reception apparatus 102 will be described next with reference to FIG. 8. The power reception apparatus 102 determines whether the power reception apparatus 102 can perform control to form a closed circuit including the power reception coil 201 and the resonant capacitor 207 for second Q factor measurement (step S801). Upon determining that the control to form a closed circuit is possible (YES in step S801), the power reception apparatus 102 advances the process to step S802. Upon determining that the control to form a closed circuit is not possible (NO in step S801), the power reception apparatus 102 advances the process to step S805. In step S802, the power reception apparatus 102 determines whether the self-apparatus can perform measurement of the second Q factor of the power reception circuit. If the measurement of the second Q factor is possible (YES in step S802), the power reception apparatus 102 advances the process to step S803. If the measurement of the second Q factor is not possible (NO in step S802), the power reception apparatus 102 advances the process to step S805. In step S803, the power reception apparatus 102 measures the second Q factor. After that, in step S804, the power reception apparatus 102 transmits the Q factor measured in step S803 to the power transmission apparatus 100, and advances the process to step S805. In step S805, the power reception apparatus 102 receives the result of foreign object detection from the power transmission apparatus 100, and ends the processing.

In the processing example described with reference to FIG. 8, in step S801, the power reception apparatus 102 determines that the control to form a closed circuit including the power reception coil 201 and the resonant capacitor 207 can be performed for second Q factor measurement. Also, in step S802, the power reception apparatus 102 determines that the self-apparatus can measure the second Q factor of the power reception circuit. Then, the power reception apparatus 102 executes the processes of steps S803 to S805, and ends the processing shown in FIG. 8.

(Procedure of Second Q Factor Measurement Processing by Power Transmission Apparatus 100)

Figure 9:
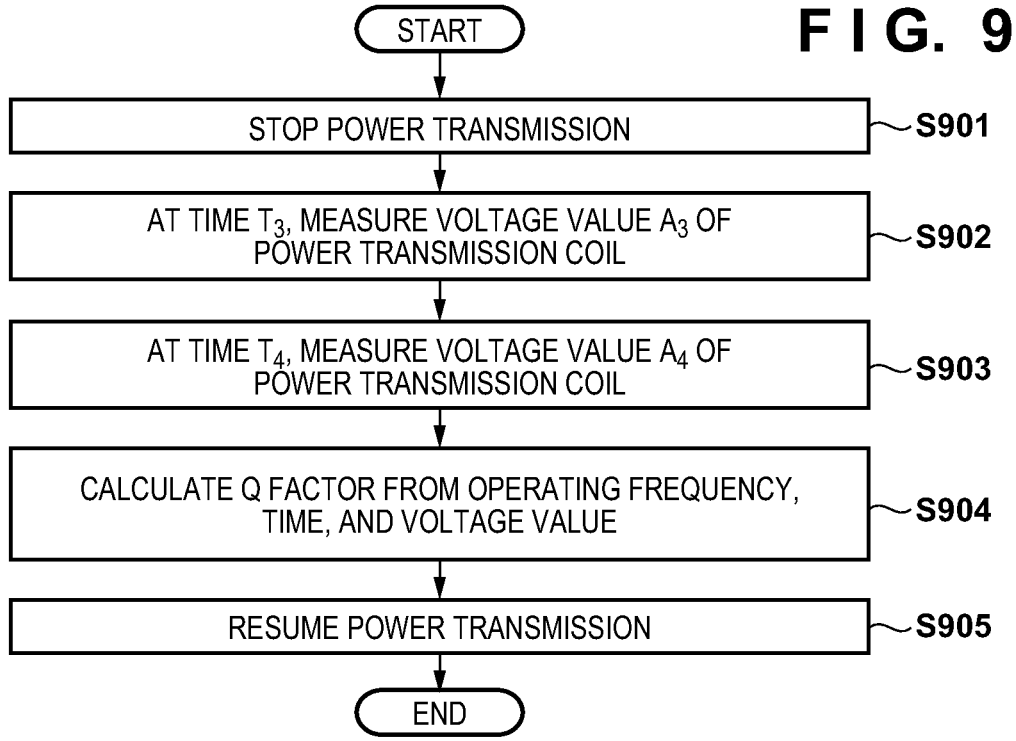
FIG. 9 is a flowchart showing an example of the procedure of second Q factor measurement processing by the power transmission apparatus.

An example of the procedure of second Q factor measurement processing by the power transmission apparatus 100, which is executed in step S704 or S709 described above, will be described with reference to FIG. 9. For example, after completion of transmission of the ACK in F626 (completion of sending of the trailing edge of the ACK in the time domain), the power transmission apparatus 100 stops power transmission in 50 ms that is the value negotiated in the negotiation of the measurement start time (step S901). The power transmission apparatus 100 measures the voltage value $A_3$ of the power transmission coil at time $T_3$ (step S902), and measures the voltage value $A_4$ of the power transmission coil at time $T_4$ (step S903). The power transmission apparatus 100 calculates the Q factor in the above-described way based on the operating frequency, the time of measurement, and the voltage value (step S904). Then, the power transmission apparatus 100 resumes power transmission after the elapse of a time of 100 ms or more, which is the value negotiated in the negotiation of the Window length, from the stop of power transmission in step S901 (step S905), and ends the processing.

(Procedure of Second Q Factor Measurement Processing by Power Reception Apparatus 102)

Figure 10:
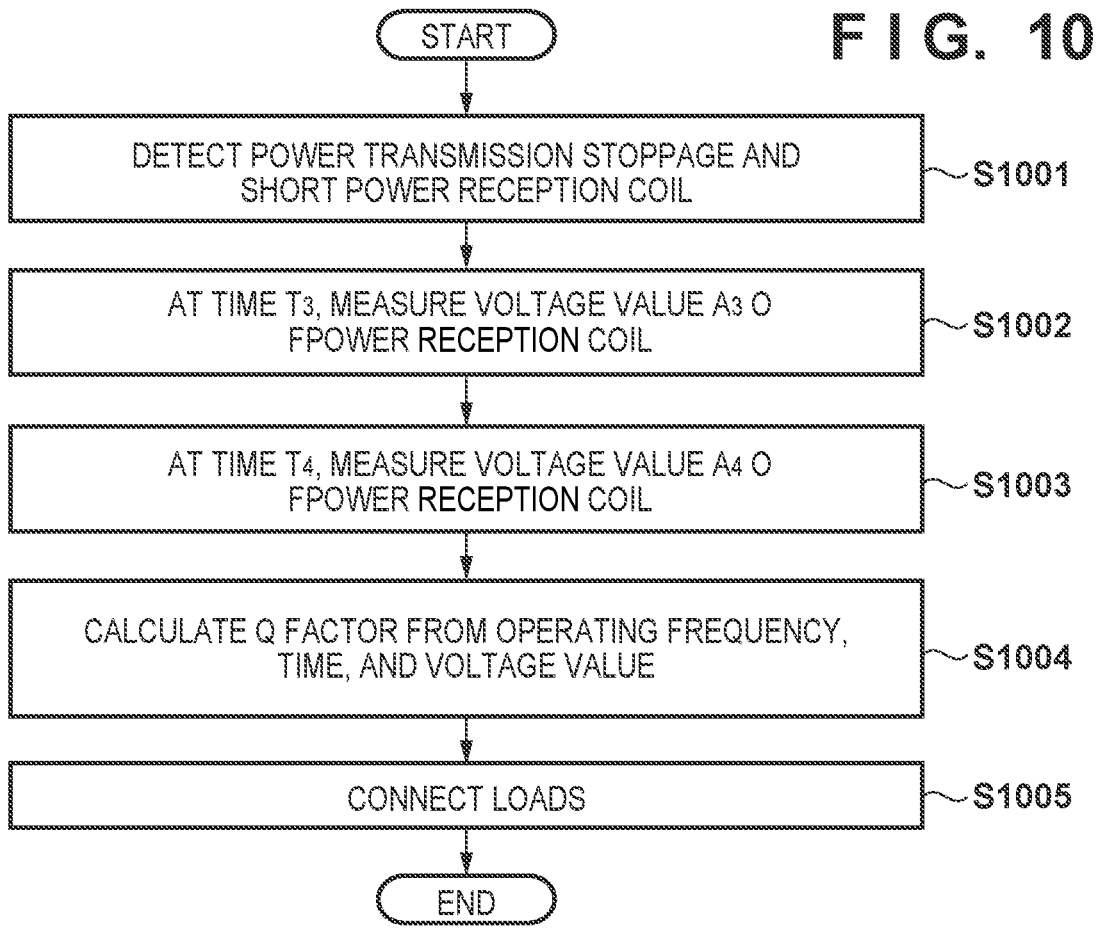
FIG. 10 is a flowchart showing an example of the procedure of second Q factor measurement processing by the power reception apparatus.

An example of the procedure of second Q factor measurement processing by the power reception apparatus 102, which is executed in step S803, will be described with reference to FIG. 10. After completion of reception of the ACK in F626 (completion of reception of the trailing edge of the ACK in the time domain), the power reception apparatus 102 detects that the power transmission is stopped in 50 ms that is the value negotiated in the negotiation of the measurement start time. The power reception apparatus 102 executes control to form a closed circuit including the power reception coil 201 and the resonant capacitor 207 (step S1001). The power reception apparatus 102 measures the voltage value $A_3$ of the power reception coil at time $T_3$ (step S1002), and measures the voltage value $A_4$ of the power reception coil at time $T_4$ (step S1003). The power reception apparatus 102 calculates the Q factor based on the operating frequency, the time of measurement, and the voltage value (step S1004). After that, the power reception apparatus 102 reconnects the loads before the elapse of 100 ms that is the value negotiated in the negotiation of the Window length from the stop of power transmission detected in step S1001 (step S1005), and ends the processing. Note that the reconnection of the loads is performed by turning off the switch 208.

The processes shown in FIGS. 7 to 10 can be implemented by, for example, the control unit 300 of the power transmission apparatus 100 or the control unit 200 of the power reception apparatus 102 reading out a program stored in advance and executing it. However, the present disclosure is not limited to this, and at least a part of the processing may be implemented by hardware. When implementing the processing by hardware, for example, a dedicated circuit can automatically be generated, using a predetermined compiler, on an FPGA from a program configured to implement the processing steps. Here, FPGA is short for Field Programmable Gate Array. Also, like the FPGA, a Gate Array circuit may be formed to implement the hardware configured to execute at least a part of the above-described processing.

In this embodiment, since the measurement start time is negotiated in advance, the power reception apparatus 102 can recognize the timing at which the power transmission apparatus 100 stops power transmission, and can appropriately start second Q factor measurement. At this time, since the appropriate measurement start time is set by the negotiation of the measurement start time in accordance with processing to be executed by the power reception apparatus 102 or its processing capability, the second Q factor measurement can be started at a timing suitable for the power reception apparatus 102. For example, if the power reception apparatus 102 needs to transmit another packet near the time of performing second Q factor measurement, the measurement start time can be negotiated such that the second Q factor measurement can be completed before the start of packet transmission. This can avoid instantaneous disconnection of power transmission for second Q factor measurement during transmission of another packet by the power reception apparatus 102 and prevent the transmission efficiency from deteriorating. If time is taken to start second Q factor measurement by the power reception apparatus 102 due to the hardware configuration or the processing capability of the power reception apparatus 102, the measurement start time is decided to a later timing in accordance with the capability of the power reception apparatus 102. This allows the power transmission apparatus 100 to stop power transmission at a timing at which, for example, the power reception apparatus 102 completes formation of the closed circuit and can start second Q factor measurement processing.

Also, in this embodiment, since the negotiation of the Window length is performed in advance, the power reception apparatus 102 can reconnect the power reception coil 201 to the loads at an appropriate timing. That is, if power transmission is resumed when the closed circuit is being formed in the power reception apparatus 102, an excessive current may flow to the power reception coil 201 and the resonant capacitor 207. On the other hand, in this embodiment, since the Window length is decided in advance by the negotiation, such a situation can be prevented from occurring. In addition, the time necessary for second Q factor measurement may change depending on the performance of the power reception apparatus 102 or requested measurement accuracy. On the other hand, the power reception apparatus 102 according to this embodiment negotiates about the Window length in accordance with the performance of the self-apparatus or requested measurement accuracy, thereby ensuring a sufficient measurement time and preventing measurement from failing or the measurement accuracy from lowering.

Note that in the above description, all of the measurement start timing, the period length of measurement, and the period (timeout time) until the report of second Q factor measurement in the power reception apparatus are decided by negotiation. At least some of these may be negotiated. That is, for example, only one of these may be negotiated, or only two of these may be negotiated. That is, these elements may be used independently, and not all of these need to be always used.

According to the present disclosure, it is possible to more accurately execute, in a power transmission apparatus and a power reception apparatus, which comply with the WPC standard, detection of an object different from the power reception apparatus.

Other Embodiments

Embodiment(s) of the present disclosure can also be realized by a computer of a system or apparatus that reads out and executes computer executable instructions (e.g., one or more programs) recorded on a storage medium (which may also be referred to more fully as a 'non-transitory computer-readable storage medium') to perform the functions of one or more of the above-described embodiment(s) and/or that includes one or more circuits (e.g., application specific integrated circuit (ASIC)) for performing the functions of one or more of the above-described embodiment(s), and by a method performed by the computer of the system or apparatus by, for example, reading out and executing the computer executable instructions from the storage medium to perform the functions of one or more of the above-described embodiment(s) and/or controlling the one or more circuits to perform the functions of one or more of the above-described embodiment(s). The computer may comprise one or more processors (e.g., central processing unit (CPU), micro processing unit (MPU)) and may include a network of separate computers or separate processors to read out and execute the computer executable instructions. The computer executable instructions may be provided to the computer, for example, from a network or the storage medium. The storage medium may include, for example, one or more of a hard disk, a random-access memory (RAM), a read only memory (ROM), a storage of distributed computing systems, an optical disk (such as a compact disc (CD), digital versatile disc (DVD), or Blu-ray Disc (BD)™), a flash memory device, a memory card, and the like.

While the present disclosure has been described with reference to exemplary embodiments, it is to be understood that the present disclosure is not limited to the disclosed exemplary embodiments. The scope of the following claims is to be accorded the broadest interpretation so as to encompass all such modifications and equivalent structures and functions.

The invention claimed is:

1. A power transmission apparatus comprising:
a power transmission unit configured to wirelessly transmit power to a power reception apparatus;
a communication unit configured to communicate with the power reception apparatus; and
a measurement unit configured to measure a Q factor using decay of a waveform in a period in which the power transmission apparatus limits the power transmission in a Power Transfer phase for performing power transmission from the power transmission apparatus to the power reception apparatus,
wherein the communication unit is configured to receive information regarding measurement processing of the Q factor in the period in which the power transmission apparatus limits the power transmission in the Power Transfer phase.

2. The power transmission apparatus according to claim 1, further comprising a detection unit configured to perform detection processing of a foreign object based on the measured Q factor.

3. The power transmission apparatus according to claim 1, wherein the information includes information regarding the period in which the power transmission apparatus limits the power transmission.

4. The power transmission apparatus according to claim 1, wherein the information is received via a Configuration Packet in a standard of the Wireless Power Consortium.

5. The power transmission apparatus according to claim 1, wherein the communication unit performs negotiation with the power reception apparatus concerning a length of the period in which the power transmission apparatus limits the power transmission.

6. The power transmission apparatus according to claim 1, wherein the communication unit receives a request of the measurement processing from the power reception apparatus.

7. A power reception apparatus comprising:
a power reception unit configured to wirelessly receive power from a power transmission apparatus; and
a communication unit configured to transmit information regarding processing that the power transmission apparatus performs in a Power Transfer phase for performing power transmission from the power transmission apparatus to the power reception apparatus, and that is measurement processing of a Q factor using decay of a waveform in a period in which the power transmission apparatus limits the power transmission in the Power Transfer phase.

8. The power reception apparatus according to claim 7, wherein the information includes information regarding the period in which the power transmission apparatus limits the power transmission.

9. The power reception apparatus according to claim 7, wherein the communication means performs negotiation with the power transmission apparatus concerning a length of the period in which the power transmission apparatus limits the power transmission.

10. The power reception apparatus according to claim 7, wherein the communication means transmits a request of the measurement processing to the power reception apparatus.

11. A method for a power transmission apparatus, comprising:
measuring a Q factor using decay of a waveform in a period in which the power transmission apparatus limits the power transmission in a Power Transfer phase for performing power transmission from the power transmission apparatus to a power reception apparatus; and
receiving information regarding measurement processing of the Q factor in the period in which the power transmission apparatus limits the power transmission in the Power Transfer phase.

12. A non-transitory computer-readable storage medium that stores a program for causing a computer to execute a method for a power transmission apparatus, the method comprising:
measuring a Q factor using decay of a waveform in a period in which the power transmission apparatus limits the power transmission in a Power Transfer phase for performing power transmission from the power transmission apparatus to a power reception apparatus; and
receiving information regarding measurement processing of the Q factor in the period in which the power transmission apparatus limits the power transmission in the Power Transfer phase.

* * * * *